(12) United States Patent
Yanase et al.

(10) Patent No.: US 6,727,591 B2
(45) Date of Patent: Apr. 27, 2004

(54) MULTI-PIECE SUBSTRATE AND METHOD OF MANUFACTURING THE SUBSTRATE

(75) Inventors: Makoto Yanase, Gifu (JP); Katsumi Sagisaka, Gifu (JP); Isao Shimada, Gifu (JP); Tatsuya Okunishi, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/297,926

(22) PCT Filed: May 31, 2001

(86) PCT No.: PCT/JP01/04630
§ 371 (c)(1),
(2), (4) Date: Dec. 19, 2002

(87) PCT Pub. No.: WO02/078410
PCT Pub. Date: Oct. 3, 2002

(65) Prior Publication Data
US 2003/0178725 A1 Sep. 25, 2003

(30) Foreign Application Priority Data
Mar. 26, 2001 (JP) ............................................ 2001-87620
Mar. 26, 2001 (JP) ............................................ 2001-87635

(51) Int. Cl.$^7$ .............................................. H01L 23/48
(52) U.S. Cl. ........................ 257/758; 438/622; 361/784
(58) Field of Search ................................ 361/784, 792; 438/622; 257/758

(56) References Cited

U.S. PATENT DOCUMENTS 4,946,734 A * 8/1990 Sugawara et al. .......... 428/209
5,065,285 A * 11/1991 Nagai et al. ................ 361/792

FOREIGN PATENT DOCUMENTS

| JP | 64-48489 | 2/1989 |
|----|----------|--------|
| JP | 63073/1993 | 8/1993 |
| JP | 9-172232 | 6/1997 |
| JP | 10-12993 | 1/1998 |
| JP | 11-68290 | 3/1999 |

* cited by examiner

*Primary Examiner*—Douglas Wille
(74) *Attorney, Agent, or Firm*—Oblon, Spivak, McClelland, Maier & Neustadt, P.C.

(57) ABSTRACT

It is intended to provide multi-piece circuit boards capable of preventing lowering of strength of joint sections between piece sections after cutoff and other sections, and determining material of flame sections regardless of material of a piece section, and board manufacturing method of such multi-piece circuit boards. For a mixed board including a defective piece section and a good piece section in a state in which an outermost layer is not formed yet, cut lines are made around bridges and are joined together by adhesive, and an upper layer is provided thereon, whereby a multi-piece circuit board mounted on good piece sections only is formed. A frame section may be formed by arranging respective piece sections manufactured in advance at positions at which the piece sections are to be present and injecting fluid matter to surround the respective piece sections arranged to form the frame section. Furthermore, joints between respective piece sections and frame section may be provided on the frame section to surround roots of respective bridges. Furthermore, an adhesive sheet may cover each joint.

17 Claims, 25 Drawing Sheets

MULTI-PIECE SUBSTRATE AND METHOD OF MANUFACTURING THE SUBSTRATE

TECHNICAL FIELD

The present invention relates to a multi-piece circuit board constituted so that a plurality of piece section are included in one board. More specifically, the present invention relates to a multi-piece circuit board (so-called jigsaw board) constituted so that only good piece sections are included in one board and to a manufacturing method therefor.

BACKGROUND ART

There is known, as a circuit board, a multi-piece circuit board constituted so that a plurality of piece sections are included in one board. As for multi-piece circuit boards, it is sometimes required, for example, that all piece sections are good pieces to meet the demand of later steps. In actual process, however, it is difficult to completely prevent a multi-piece circuit board including defective piece sections. Nevertheless, it is disadvantageous in terms of the effective use of resources to scrap other good piece sections in a multi-piece circuit board because at least one failure piece section is included in the board.

Considering this, if there is a board which includes both defective piece sections and good piece sections (to be referred to as "mixed board" hereinafter), the defective piece sections are removed from the circuit board, good piece sections which are detached from another mixed board are attached to a resultant vacant location and a so-called jigsaw board is thereby provided. By doing so, it is possible to provide a multi-piece circuit board constituted so that all piece sections are good piece sections to later steps while making effective use of resources.

However, according to the conventional jigsaw board, the attachment and detachment of a piece section is conducted by cutting off and joining bridges which couple piece sections to a frame section after forming an outermost layer. This causes the following disadvantages. Namely, a difference in height may possibly occur among the frame section, piece sections which are originally loaded to the frame section and the piece sections attached later to the frame section by cut-off and bonding. Due to this, in the later step of printing solder paste to, for example, mount electronic components, good printing cannot be performed because of the difference in height on the surface of the circuit board. In this case, because of insufficient soldering, there is high probability of occurrence of defects. In addition, since the strength of a bridge (joint section) is lowered by cut-off and bonding, there is a probability that attached pieces unexpectedly come off in later steps.

Furthermore, since a conventional jigsaw board is a circuit board which is manufactured so that all the sections including the frame section are integrally manufactured except for the piece sections attached in place of defective piece sections, all the sections are made of similar materials. This causes the following disadvantage. In the later step of handling the multi-piece circuit board, it is required that the frame section has a certain degree of strength for operation. On the other hand, the piece sections which form a part of a finished product recently tend to be made thinner to satisfy the demand of providing a compact product. As the piece sections are made thinner, the frame section becomes thinner, accordingly. Due to this, to make the piece sections thinner is a trade-off for the requirement of strength. To ensure required strength, the width of the frame section may be increased. If so, however, number of piece sections per board cannot be increased.

Moreover, the frame section becomes unnecessary after the piece sections are employed. However, since the frame section is basically made of the same material as that of the piece sections, it is not always easy to dispose of or recycle the frame section.

The present invention has been, therefore, achieved to solve the above-stated disadvantages. Specifically, the object of the present invention is to provide a multi-piece circuit board and a manufacturing method therefor capable of ensuring flatness between a piece section after cutoff and bonding and the other sections even if one piece section is cut off and another piece section is bonded, preventing the lowering of the strength of a joint section and determining the material of a frame section irrespectively of piece sections.

DISCLOSURE OF THE INVENTION

A multi-piece circuit board according to the present invention which has been achieved to solve the above-stated disadvantages is a multi-piece circuit board comprising: a frame section; and a plurality of piece sections connected to the frame section, characterized in that a joint is provided in an inner layer at a connection portion of said frame section and a piece section for at least one piece section, and the joint is covered with an upper layer. It is noted that "the upper layer" includes all layers provided outside of the layer on which the joint is present. For example, if a solder resist layer has sufficient junction strength, the solder resist layer solely may compose the upper layer.

In this multi-piece circuit board, the joint between the piece sections cut off and bonded and the frame section is present in an inner layer in the connecting portion. Here, the joint may be present in the connecting portion itself (so-called bridge) or in the frame section or the piece section in the neighborhood of the connecting portion. If the joint is present on the piece side, however, the presence of the joint in the piece section causes a damage to the piece section which becomes a product and this is not, therefore, impractical. As can be seen, the attachment and detachment of the piece section are conducted by cutting off and coupling the connected portion in which the piece section is connected to the frame section. Due to this, there can be an aspect fearing of the lowering of the strength of the joint portion formed by cutoff and bonding. However, the joint is present in the inner layer in the connected portion and the joint is surely covered with the upper layer. In other words, the upper layer reinforces the strength of the joint section. As a result, the lowering of the strength of the joint section is prevented. It is, therefore, possible to give the same strength as the inherent strength of the circuit board to the joint section. It is thereby possible to prevent the piece section from unexpectedly coming off in later steps.

Further, the joint is covered with the upper layer. That is, after the frame section is coupled with the piece sections by the joint, the upper layer is further provided. In addition, since pressing is performed when forming the upper layer, it is possible to secure the flatness between the piece section cut off and bonded and the other sections. Besides, since the joint is covered with the upper layer, the joint is invisible from the outside and good appearance is obtained accordingly.

A method for manufacturing a multi-piece circuit board according to the present invention is a method for manufacturing a multi-piece circuit board comprising a frame section and a plurality of piece sections connected to the frame section, which method is characterized by, if a plurality of multi-piece sections each including a defective piece section and a good piece section in a state in which an outermost layer is not formed yet, making a cut line around the defective piece section on one of the multi-piece circuit boards, and removing the piece section; similarly getting out the good piece section of another multi-piece circuit board; inserting the good piece section gotten out of the other multi-piece circuit board into a vacant location from which the defective piece section is removed; and providing an upper layer to cover a joint in that state.

According to this manufacturing method, a defective piece section is gotten out of one mixed board on which an outermost layer pattern is not formed yet. A cut line at this time may come into a connecting portion or the neighborhood of the connecting portion or, to be specific, into a bridge which couples the piece section to the frame section or the frame section in the neighborhood of the root of the bridge. Likewise, a good piece section is gotten out of another mixed board on which an outermost layer pattern is not formed yet. The two cut lines are joined together. As a result, a joint is formed. In a state in which the joint is formed, an upper layer is further provided to cover the joint. Consequently, the multi-piece circuit board having a joint present in an inner layer in a connected portion is manufactured.

Further, in the method for manufacturing a multi-piece circuit board according to the present invention, it is preferable that after joining cut lines together by adhesive, the upper layer is provided. This is because the junction strength of the joint is secured by the adhesive. By fully covering the joint with the upper layer, the strength of the joint is reinforced. It is, therefore, possible to ensure preventing the lowering of the strength of the joint section formed by cutoff and bonding.

In the method for manufacturing a multi-piece circuit board according to the present invention, it is also preferable that a member containing an adhesive component is employed as the upper layer. This is because the adhesive component contained in the upper layer is effused into the joint when providing multiple layers to thereby bond the cut lines to each other. Further, the strength of the joint section is reinforced by the upper layer, whereby it is possible to ensure preventing the lowering of the strength of the joint section formed by cutoff and bonding.

Further, another multi-piece circuit board according to the present invention is a multi-piece circuit board comprising: a frame section; and a plurality of piece sections connected to the frame section by bridges, respectively, characterized in that the frame section is obtained by molding out of fluid matter, and the plurality of piece sections are manufactured before molding of the frame section.

Furthermore, according to a method for manufacturing a multi-piece circuit board according to the present invention, in the manufacturing of a multi-piece circuit board comprising a frame section and a plurality of piece sections connected to the frame sections by bridges, respectively, the respective piece sections manufactured in advance are arranged at positions at which the piece sections are to be present in the multi-piece circuit board; and a fluid matter is injected to surround the respective piece sections arranged to form the frame section using the fluid matter. The above-stated multi-piece circuit board is thus manufactured.

In the multi-piece circuit board, the fluid matter is formed into the frame section. It is, therefore, possible to select a fluid matter irrespectively of the material of the piece section. Accordingly, it suffices to select a material which can be easily disposed of or recycled after the piece section is removed in a later step.

It is preferable that this multi-piece circuit board further includes a protrusion at a position coming into the frame section, and that the protrusion is connected to the piece section by the bridge and manufactured together with the piece section. As a result, a larger junction area is secured between the piece section and the frame section. Consequently, it is possible to further ensure obtaining the junction strength between the piece section and the frame section.

To this end, in the manufacturing thereof, portions having protrusions connected by the bridges may be employed as the respective piece sections arranged, and by forming the frame section using the fluid matter, the protrusions may be turned into a state of coming into the frame section.

Further, it is preferable that when forming the frame section, the fluid matter is injected from a position outside of an edge of the frame section on the multi-piece circuit board when forming the frame section, and that a convex section at the injection position is broken off after forming the frame section. By doing so, it is possible to ensure the better flatness of the frame section. That is, a convex fin is inadvertently formed in the portion of the injection port. By breaking off the portion, no fin is provided on the resultant frame section.

Further, another multi-piece circuit board according to the present invention is a multi-piece circuit board comprising: a frame section; and a plurality of piece sections connected to the frame sections by bridges, respectively, characterized in that all of the plurality of piece sections are manufactured separately from the frame section, and coupled to the frame section. In addition, in a method for manufacturing the multi-piece circuit board according to the present invention, a frame section having a plurality of vacant locations for arranging a plurality of piece sections and the plurality of piece sections manufactured separately from the frame section are prepared, the piece sections in the vacant locations of the frame section are arranged, respectively, and that the piece sections are coupled to the frame section to thereby provide the multi-piece circuit board.

In this multi-piece circuit board, the frame section is manufactured separately from any one of the piece sections. In other words, this multi-piece circuit board is constituted by separately manufacturing the piece sections from the frame section and the piece sections are coupled to the frame section. It is, therefore, possible to easily make all the piece sections good piece sections and also possible to set the material of the frame section different from that of the piece section. Consequently, even if the piece sections are thin, it is possible to secure strength without increasing the width of the frame section.

It is more preferable that the multi-piece circuit board according to the present invention is constituted so that joints between the respective piece sections and the frame section are provided on the frame section to surround roots of the respective bridges. Further, it is preferable that in the method for manufacturing the multi-piece circuit board according to the present invention, members each having a functional portion which includes a wiring pattern and a protrusion which is provided around the functional portion are employed as the piece sections, respectively and that a member having a concave section which corresponds to the protrusion and which is provided at edges of each of the respective vacant locations is employed as the frame section.

By doing so, the area of each joint between each piece section and the frame section is set larger than that of the joint provided on the bridge. Due to this, the junction strength is high to thereby prevent the piece section from unexpectedly coming off in a later step.

Furthermore, another multi-piece circuit board according to the present invention comprises an adhesive sheet covering a joint between the frame section and each of the piece sections to spread over the frame section and the piece section. As the joint, there is a joint which couples the piece section having a protrusion to the frame section having a concave section corresponding to the protrusion of the piece section, or the like.

In this multi-piece circuit board, the junction strength between each piece section and the frame section is high. In addition, if the piece section includes a protrusion and this protrusion is applied as a protrusion fitted into the concave section of the frame section, then it is possible to obtain higher junction strength by covering the protrusion and the corresponding concave section with the adhesive sheet without bonding the sheet to the main body section of the piece section.

According to a method for manufacturing a multi-piece circuit board according to the present invention, in the method for manufacturing a multi-piece circuit board comprising a frame section and a plurality of piece sections connected to the frame section, the frame section and the piece sections are fitted into each other in advance and the joints are covered with an adhesive sheet later. As a result, the above-stated multi-piece circuit board is manufactured.

Furthermore, it is preferable that a metal foil is provided on a surface of the adhesive sheet between each piece section and the frame section. By doing so, it is possible to decrease the cracking of the multi-piece circuit board. It is also possible to decrease the flow of resin.

Moreover, if a member having a positioning target pattern is employed as the piece section, the positioning target pattern section is sometimes concealed by an adhesive sheet. It is, therefore, preferable to cut off the corresponding portion of the adhesive sheet in advance so as not to conceal the positioning target pattern. By doing so, it is possible to employ the positioning target pattern without being covered with the adhesive sheet.

BEST MODES FOR CARRYING OUT THE INVENTION

Modes for embodying the present invention will be described hereinafter in detail with reference to the accompanying drawings.

[First Mode for Carrying Out the Invention]

Figure 1:
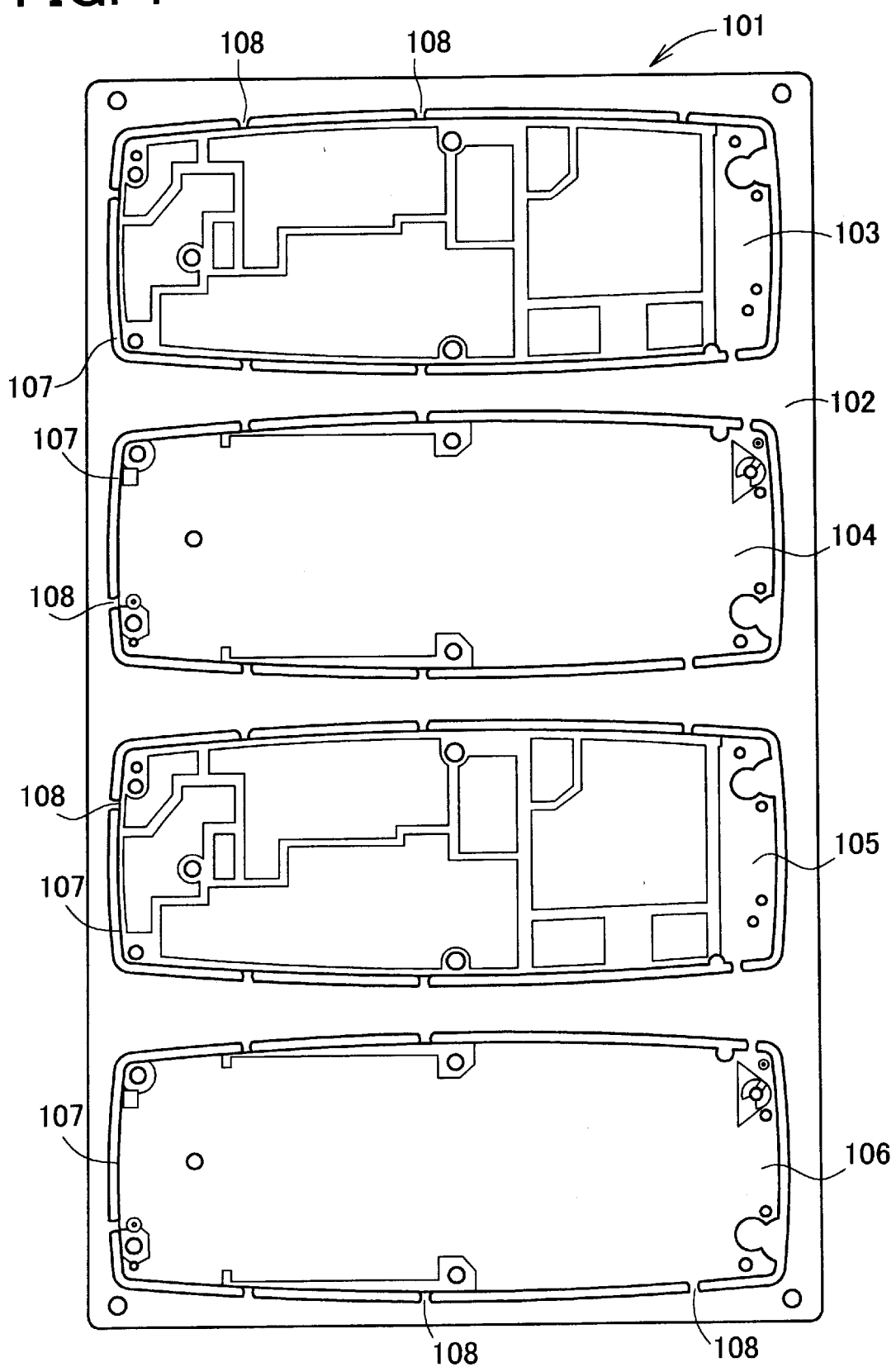
FIG. 1 is a cross-sectional view of a circuit board according to the first embodiment.

As shown in FIG. 1, a multi-piece circuit board 101 according to the first mode for carrying out the invention includes a frame section 102 and four piece sections 103 to 106. Slit 107 are formed between the piece sections 103 to 106 and the frame section 102, respectively. Several bridges 108 fixing the respective piece sections 103 to 106 to the frame section 2 are provided. In FIG. 1, the piece sections 103 and 105 have the same pattern and the piece sections 104 and 106 have the same pattern. The piece sections 103 and 105 differ in pattern from the piece sections 104 and 106. However, other sides of the pieces 104 and 106 are arranged on the surface on which right sides of the piece sections 103 and 105 are arranged and they are all the same products. The dimension of the multi-piece circuit board 1 shown in FIG. 1 is about 14 cm×24 cm.

Figure 2:
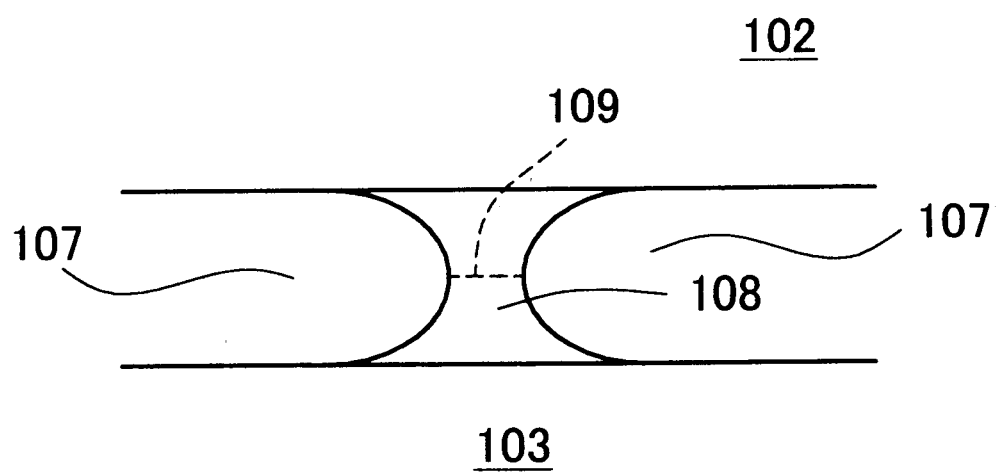
FIG. 2 is an enlarged view of a bridge on a multi-piece circuit board.

FIG. 2 shows the schematic structure of the bridge 108 on the piece section 103 which is one of the piece sections 103 to 106. In FIG. 2, the joint 109 is present almost at the center of the bridge 108 which couples the frame section 102 to the piece section 103. This joint 109 is present in the inner layer section of the bridge 108 and invisible from the outside. Further, adhesive is intervened in the joint 109. Namely, the joint 109 is bonded by the adhesive and further fully covered with upper layers. If the adhesive is employed, it is desirable to bond a heat resistant tape (a polyimide tape or the like) on the other side of the circuit board. This is intended to prevent the board from being undesirably contaminated by the effused adhesive. In addition, the joints 109 as shown in FIG. 2 are present in the inner layer sections of all the bridges 108 around the piece section 103. It is noted, however, that the joints 109 are actually, invisibly left since the upper layers are provided. On the other hand, no joints 109 as shown in FIG. 2 are present in the inner layer sections of the bridges 108 around the other piece sections 104 to 106.

The multi-piece circuit board 1 shown in FIG. 1 is originally an mixed board in which the piece sections 104 to 106 are good piece sections and a defective piece section is loaded to the location in which the piece section 103 is provided before an outermost layer pattern is formed. The defective piece section is removed, a good piece section 103 gotten out of another mixed board is attached to the vacant location to provide a circuit board in which all the piece sections are good, and upper layers are then provided to thereby form an outermost layer pattern. In this way, in the multi-piece circuit board 101, the joints 109 between the original sections (the frame section 102 and the piece sections 104 to 106) and the cut-off and bonded section (piece section 103) exist in the inner layer sections of the bridges 108 around the piece section 103.

Due to this, there may be an aspect that the multi-piece circuit board 101 may be confronted with the lowering of the strength of each bridge 108 around the piece section 103 which is attached by cut-off and bonding. However, such aspect is not correct. Because, the piece section 103 and the base section 102 are bonded to each other by the adhesive at the bridges 108 and the upper layers are further provided. Namely, the joints 109 are fully covered with the upper layers. This can, therefore, reinforce the strength of each bridge 108 around the piece section 103 which is attached by cut-off and bonding. As a result, it is possible to secure almost the same strength of each bridge 108 around the piece section 103 attached by cut-off and bonding as that of each bridge around the piece sections 104 to 106. Further, since the upper layers are provided after the joints 109 are formed, the both sides of the joints 109 are flattened by pressing which is performed while providing the upper layers. Besides, since the joints 109 are covered with and concealed by the upper layers, good appearance is ensured.

Figure 3:
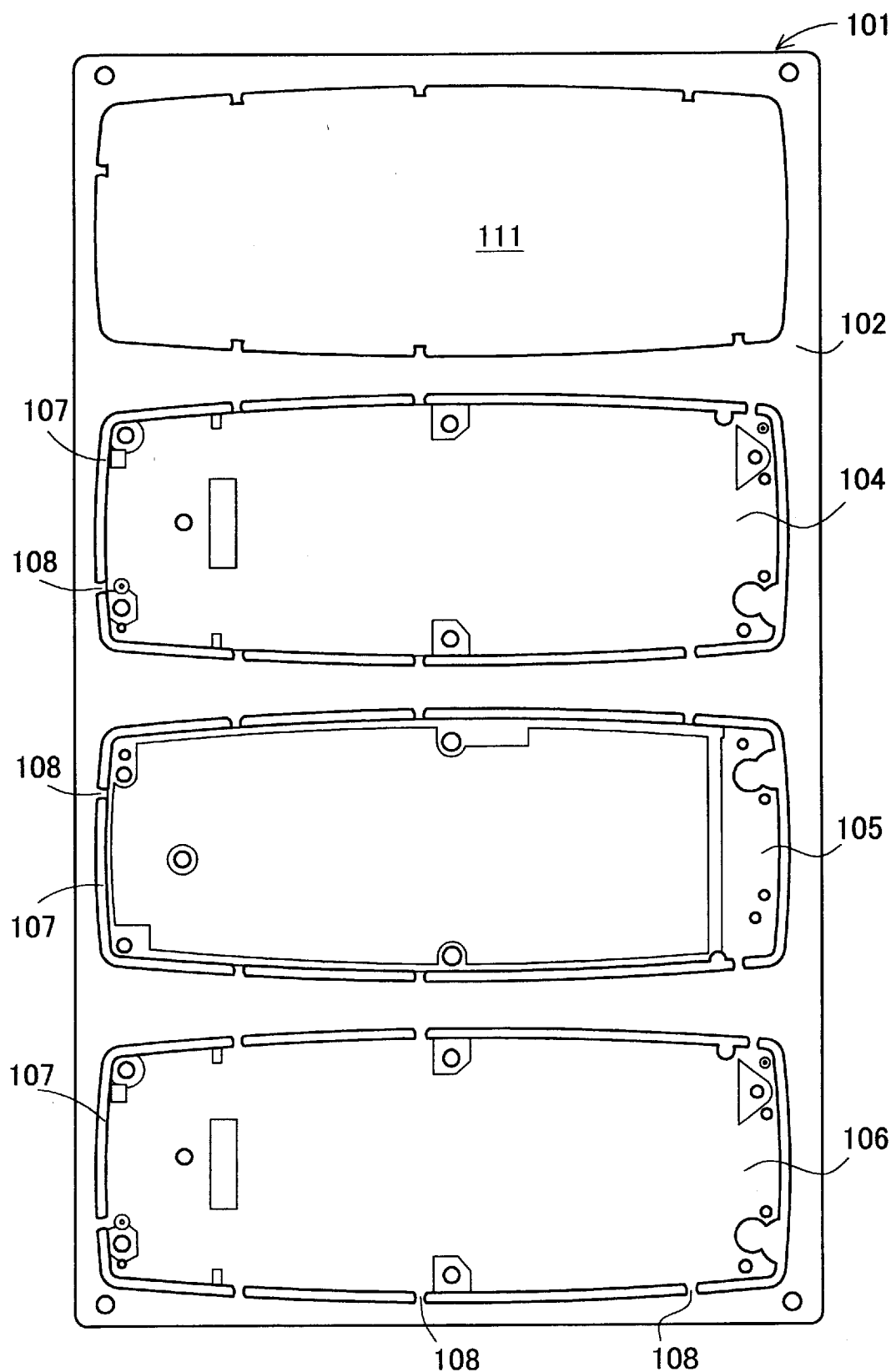
FIG. 3 is a plan view showing a state in which a defective piece section is removed from an original multi-piece circuit board.

The multi-piece circuit board 101 is manufactured through the cut-off and bonding process which will be schematically described later. First, a PASS/FAIL test is conducted to each piece section of the multi-piece circuit board before an outermost layer pattern is formed. If not less than two mixed boards are discovered by the PASS/FAIL test, a defective piece section is removed from a certain mixed board (which desirably includes many good piece sections) while the good piece sections are left as they are, to turn the mixed board into a state shown in FIG. 3. When the defective piece section is removed from the mixed board, a cut line is made almost at the center of each bridge 108 around the to-be-removed piece section by a router or the like. As a result, the to-be-removed piece section and a part of the respective bridges 108 around the piece section are cut off from the mixed board.

Figure 4:
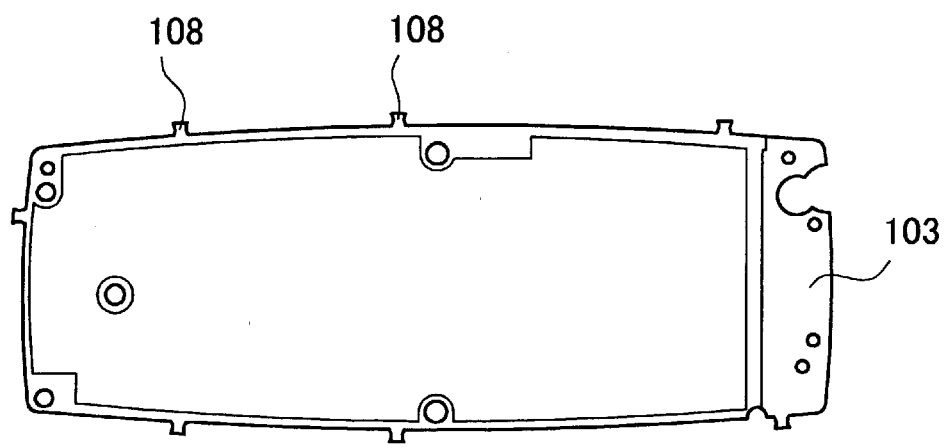
FIG. 4 is a plan view showing a good piece section gotten out of another multi-piece circuit board.
Figure 5:
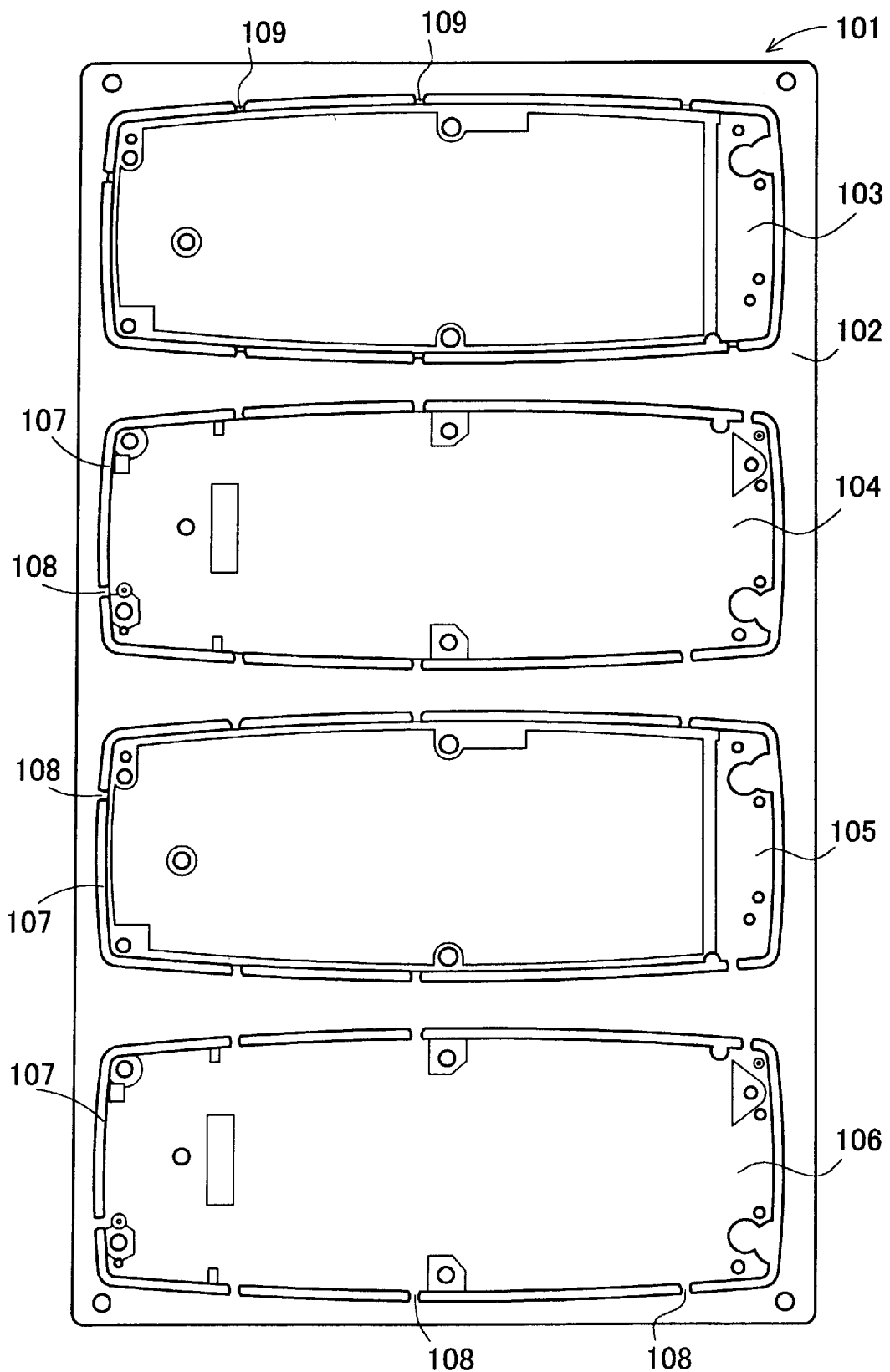
FIG. 5 is a plan view showing a state in which the good piece section is attached to a portion in which the defective piece section is removed from the original multi-piece circuit board.

On the other hand, a good piece section 103 is gotten out of another mixed board. At this moment, a cut line is made almost at the center of each bridge 108 of the piece section 103, as well. As shown in FIG. 4, a part of each bridge 108 around the piece section 103 is loaded to the piece section 103 which is gotten out. It is noted that the shapes of the cut lines of the piece sections are mated to one another in assembly. The piece section 103 shown in FIG. 4 is arranged in a vacant location 111 shown in FIG. 3 and the cut lines are bonded to one another by the adhesive. As a result, a state shown in FIG. 5 is obtained. As shown in FIG. 5, the joint 109 is present almost at the center of each bridge 108.

The adhesive employed to bond the cut lines may be a liquid adhesive or solid granular adhesive. If the latter adhesive is employed, a heat treatment or the like may be conducted to the adhesive. If an adhesive component is contained in the upper layers and supplied from the upper layers, the adhesive may not be employed to bond the cut lines. When the piece section 103 is arranged, a tool having a positioning pin vertically built may be employed and the adhesive may be hardened naturally to enhance the relative position accuracy of the piece section 103 to the frame section 102 or the other piece sections.

From the state shown in FIG. 5, upper layers are provided and an outermost layer pattern is formed, thereby obtaining the state shown in FIG. 1. In this state, since the joints 109 are covered with and concealed by the upper layers, the joints 109 are invisible from the outside.

Figure 6:
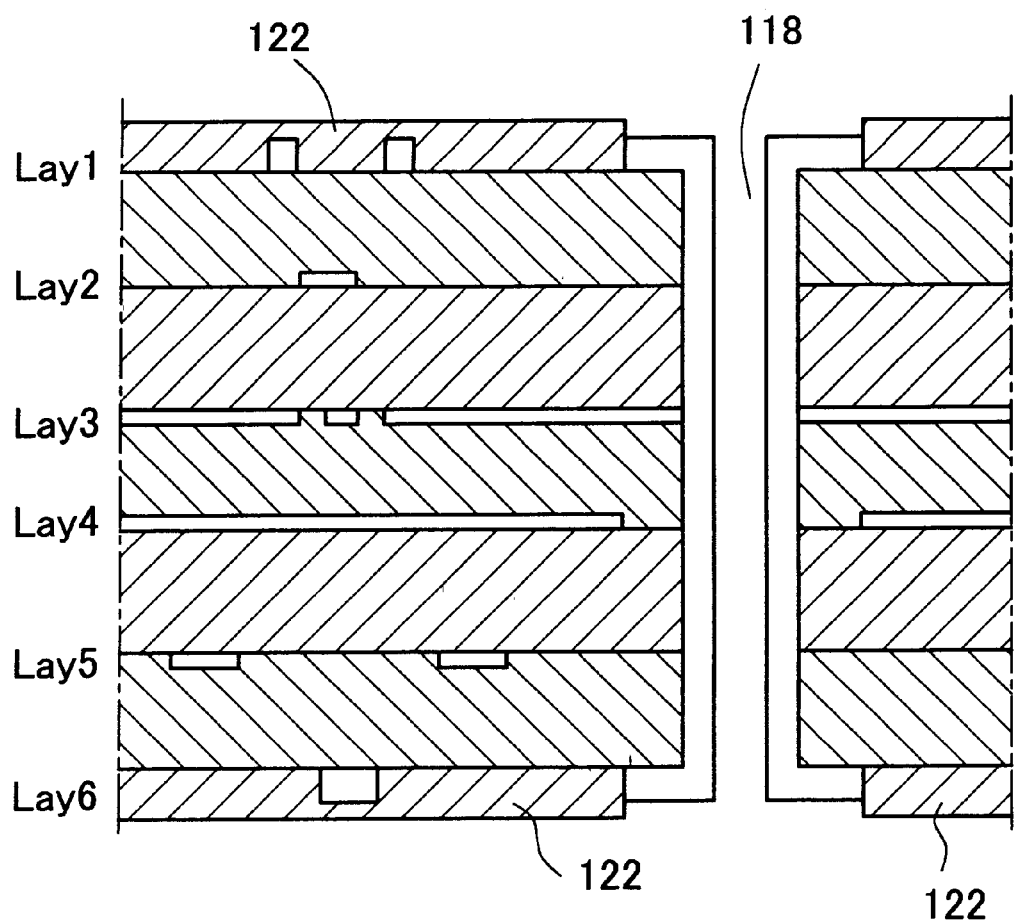
FIG. 6 is a cross-sectional view showing an example of the overall configuration of the multi-piece circuit board.
Figure 7:
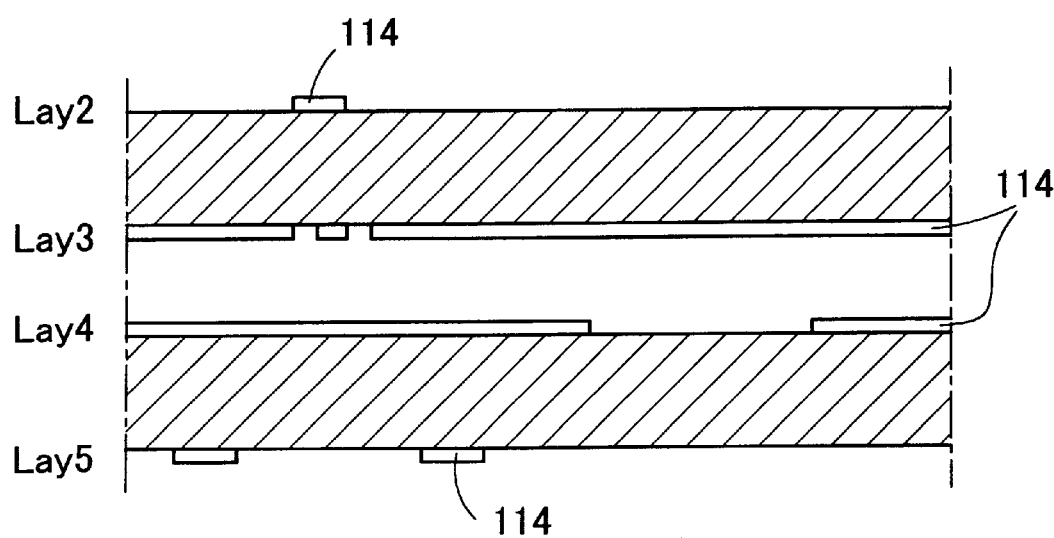
FIG. 7 is a cross-sectional view showing one step (inner pattern formation) in the manufacturing of a multi-piece circuit board.
Figure 8:
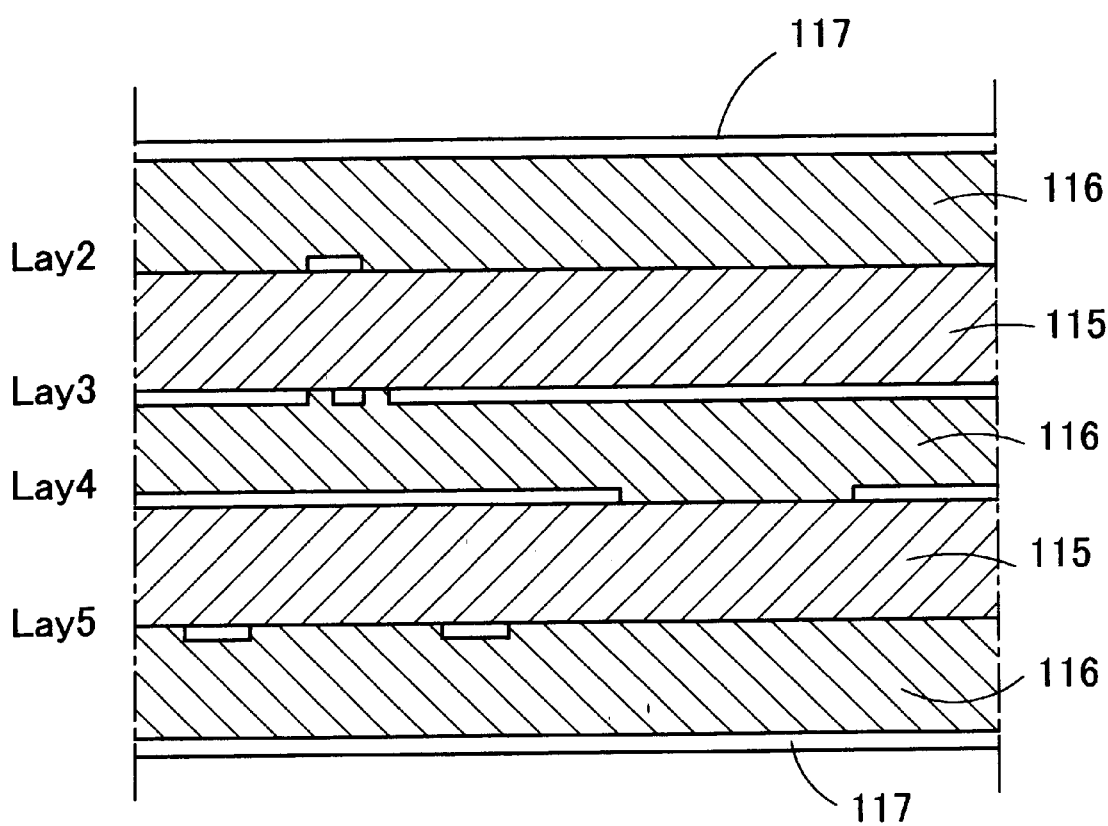
FIG. 8 is a cross-sectional view showing one step (combination and pressing) in the manufacturing of the multi-piece circuit board.

Next, how to cut off and bond the above-stated piece section in the course of the concrete manufacturing process of the multilayer wiring board will be described. By way of example, it is assumed to use a six-layer penetration subtractive method for forming a cross-sectional structure shown in FIG. 6. First, the manufacturing process for obtaining the cross-sectional structure shown in FIG. 6 will be briefly described. Initially, as base materials, the respective surfaces of two double-sided copper-clad laminates are patterned. As a result, inner layer patterns 114 shown in FIG. 7 are formed. The inner layer patterns 114 correspond to Lays 2 to 5 shown in FIG. 6, respectively. If these patterns are combined and pressed, a state shown in FIG. 8 is obtained. Namely, prepregs 116 are put between two base materials 115 and 115, and on both outer faces of them. And, copper foils 117 and 117 are arranged on both outer faces of the prepregs 116 and 116. And, they are pressed to integrate.

Figure 9:
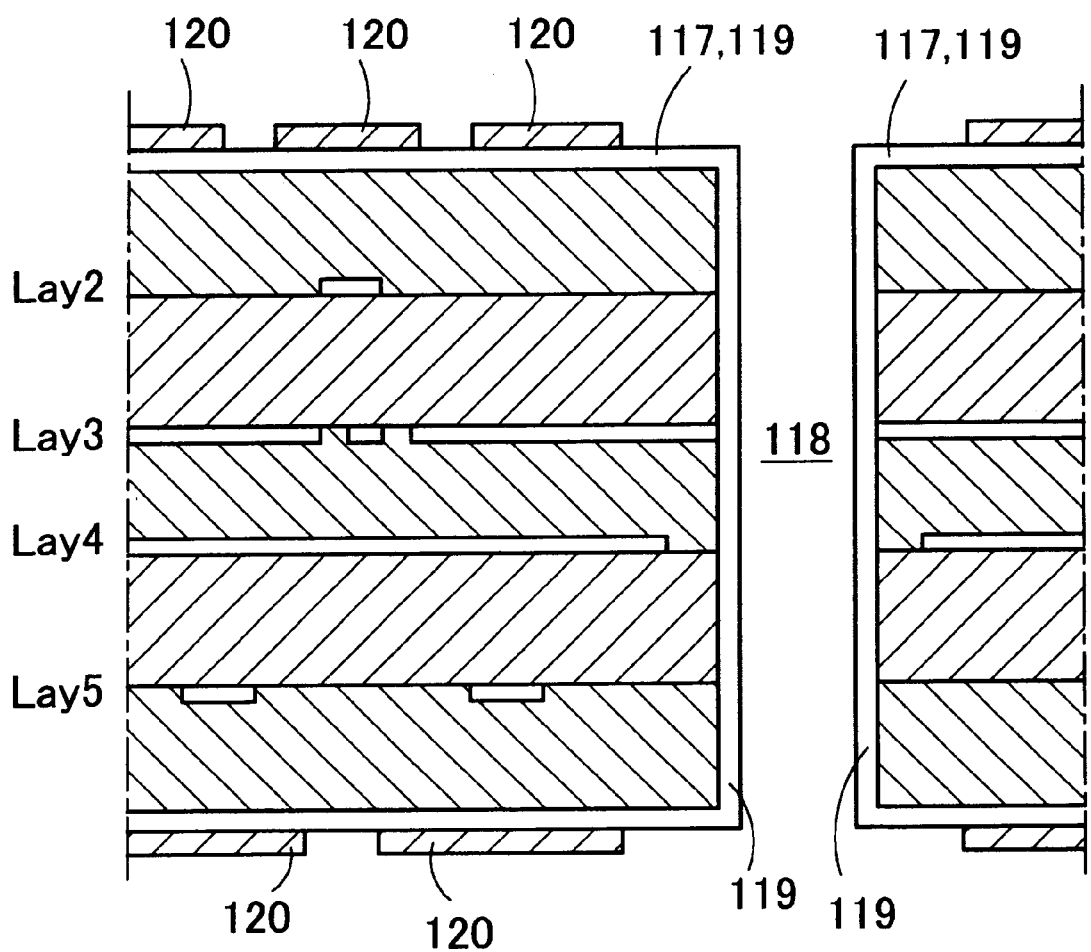
FIG. 9 is a cross-sectional view showing one step (pattern resist formation) in the manufacturing of the multi-piece circuit board.
Figure 10:
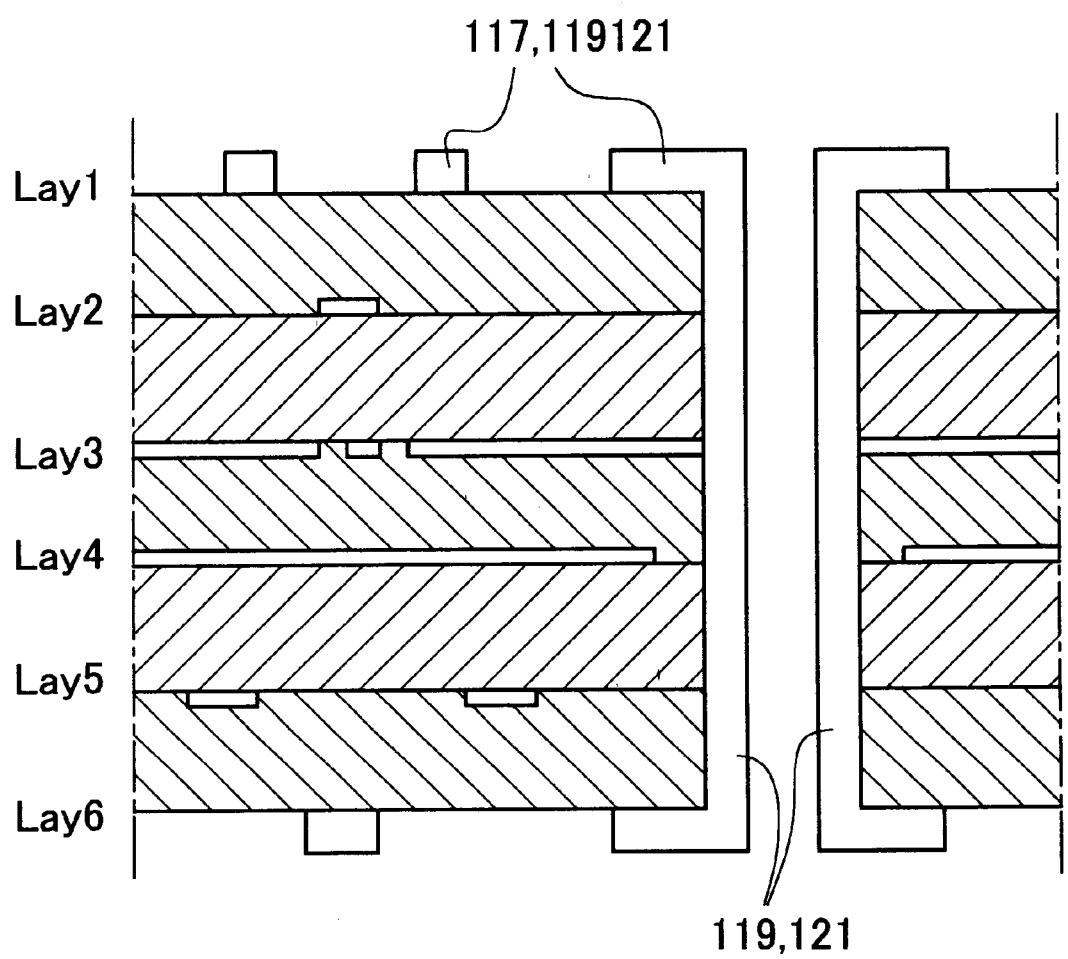
FIG. 10 is a cross-sectional view showing one step (outer layer patter formation) in the manufacturing of the multi-piece circuit board.

A penetrating hole 118 is formed in the resultant integral circuit board, chemical copper plating 119 is conducted to the entire surfaces of the integral circuit board, and pattern resists 120 are formed on the front and rear surfaces thereof to thereby obtain a state shown in FIG. 9. Next, electrolytic copper plating 121 is conducted in regions with no pattern resists 120, the pattern resists 120 are peeled off, excessive copper is removed by quick etching and a state shown in FIG. 10 is thereby obtained. As a result, outer layers Lays 1 and 6 are formed. Solder resists 122 are then formed to thereby obtain the state shown in FIG. 6. This follows outline processing and a continuity test.

In the above-stated manufacturing process, the piece section can be cut off and bonded when a certain pattern is formed and a PASS/FAIL test is conducted before the outermost layer pattern is formed. Specifically, in a state shown in FIG. 7, the piece section is cut off and bonded. By cutting off and bonding the piece section in this state, the joints 109 existing on the bridges 108 are covered with and concealed by the upper layers (the prepregs 116 and the solder resists 122). Due to this, even if the strength of each bridge 108 is lowered by cutting off and bonding the piece section 103, it is reinforced by the upper layers. In other words, the upper layers suppress the strength of each bridge 108 from being lowered. In addition, the pressing conducted when the upper layers are provided can ensure flatness. Besides, since the joints 109 are covered with and concealed by the upper layers, a good appearance can be ensured.

Moreover, to cut off and bond the piece section 103 in the state shown FIG. 7, a step of forming patterns of the Lays 1 and 6 remains. Due to this, if a wiring which connects piece sections such as a lead to a pad employed to a function test conducted after mounting components or a wiring which connects piece sections to each other or each piece section to the frame section is necessary, such a wiring can be extended without breaks by using the Lays 1 and 6. In addition, by the cutoff and bonding is conducted in such an early stage, a wasteful operation such as providing upper layers on the defective piece section can be removed. Furthermore, since the two different base materials are present at this moment, the cutoff and bonding is conducted to the individual base materials. As a result, it is possible to utilize the good piece sections as much as possible while removing the defective piece sections.

As described so far in detail, in the manufacturing of a multi-piece circuit board according to this mode for carrying out the invention, if there are not less than two mixed boards each of which includes good piece sections and defective piece sections while Lays 1 and 6 are not formed, cut lines are made in the bridges 108 which couple the frame section 102 to the piece sections 103, respectively, the cut lines are joined together and the upper layers are provided, thereby providing a so-called jigsaw circuit board. In this case, the joints 109 of the jigsaw circuit board are present in the inner layer sections of the respective bridges 108 and fully covered with the upper layers. Due to this, the strength of each bridge 108 is suppressed from being lowered by cutoff and bonding and secured to be kept almost the same as the inherent strength of the bridge 108. As a result, it is possible to avoid unexpectedly detaching the piece sections 103 cut off and bonded while handling them in later steps.

Figure 11:
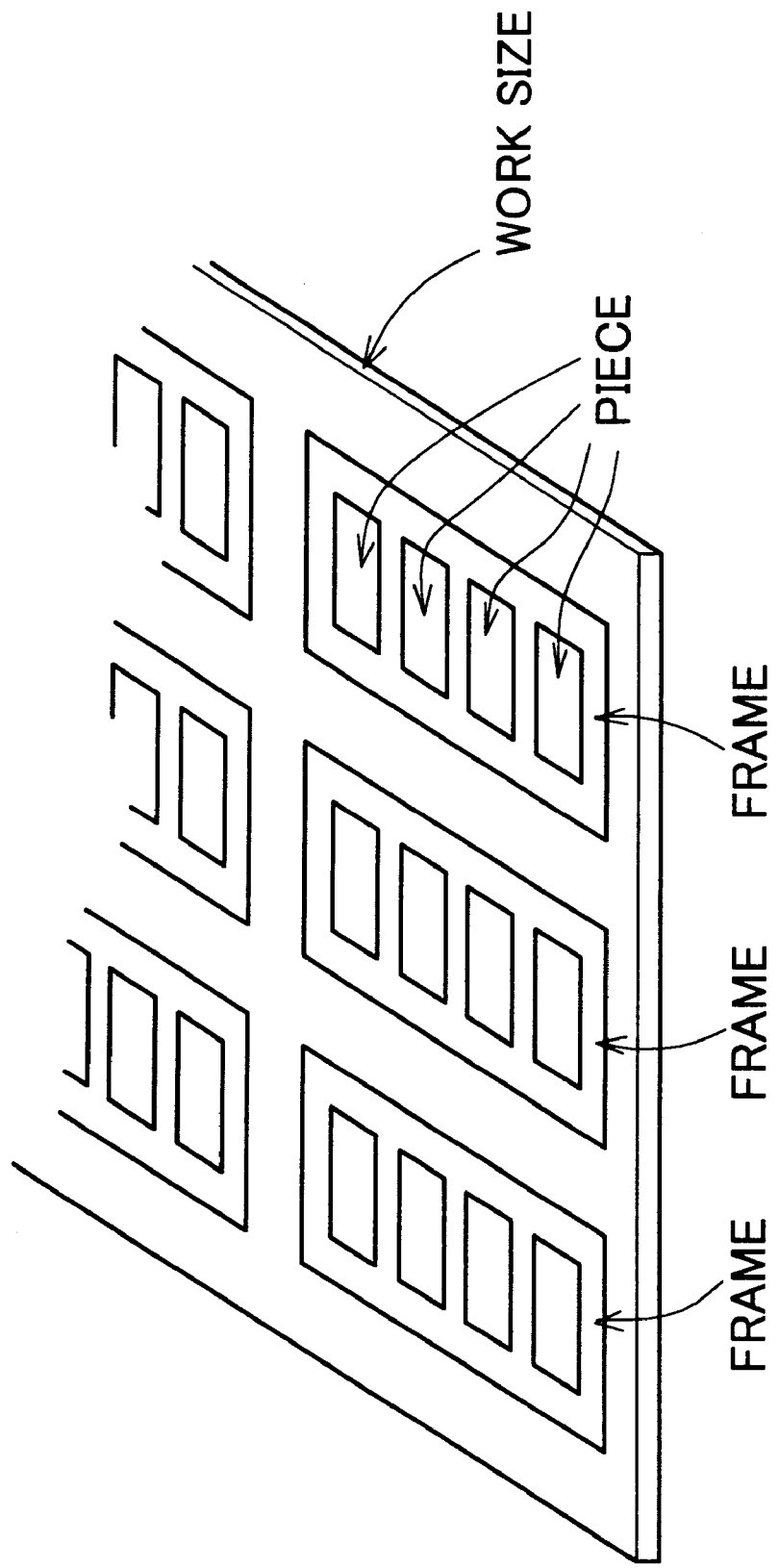
FIG. 11 is a view showing an example of the arrangement of multi-piece circuit board in a workpiece.

This mode for carrying out the invention is given only for illustrative purposes and not intended to limit the present invention. Naturally, therefore, various changes and modifications can be made to the present invention within the scope of the invention. For example, while the joints 109 is present on each bridge 108 in this mode for carrying out the invention, the joint 109 may be present not on the bridge 108 but on the frame section 2 near the bridge 108. That is, the piece section may be cut off and bonded not on the bridge but on the frame section. Further, the number of layers and outer shapes of target circuit boards, the material of each layer and the like may be set different from those in this mode for carrying out the invention. In addition, as shown in FIG. 11, a plurality of frames are sometimes included in the entire size of a workpiece and a plurality of pieces are sometimes included in each frame, depending on circuit boards. The present invention is also applicable to this case. In this case, cutoff and bonding may be conducted for each piece or each frame.

[Second Mode for Carrying Out the Invention]

Figure 12:
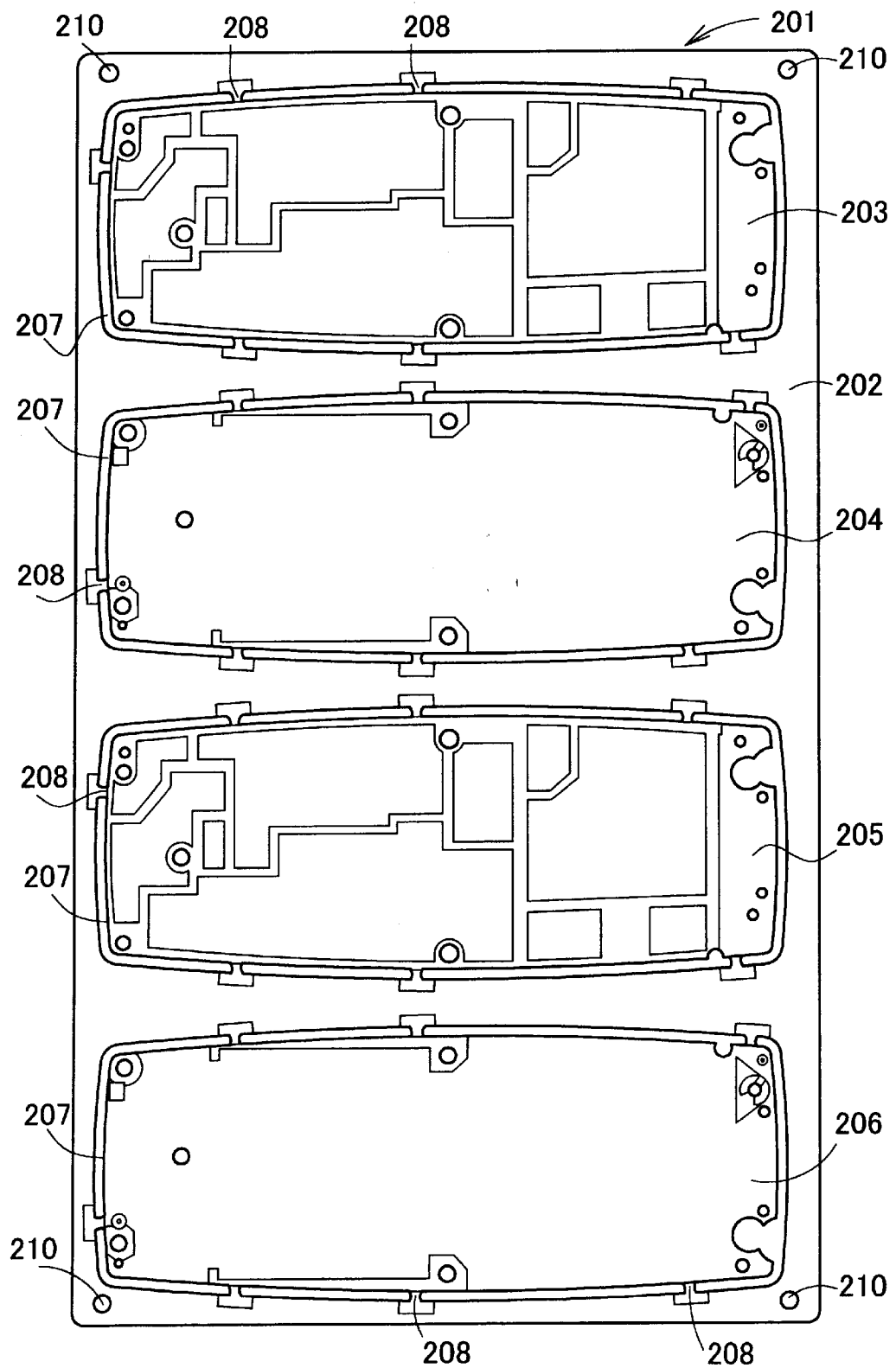
FIG. 12 is a plan view of a multi-piece circuit board according to the second embodiment.

As shown in FIG. 12, a multi-piece circuit board in this mode for carrying out the invention includes a frame section 202 and four piece sections 203 to 206. Slits 207 are formed between the piece sections 203 to 206 and the frame section 202, respectively. Several bridges 208 fixing respective piece sections 203 to 206 to the frame section 202 are provided. In FIG. 12, the piece sections 203 and 205 have the same pattern and the piece sections 204 and 206 have the same pattern. The piece sections 203 and 205 differ in pattern from the piece sections 204 and 206. However, other sides of the pieces 204 and 206 are arranged on the surface on which right sides of the piece sections 203 and 205 are arranged and they are all the same products. The dimension of the multi-piece circuit board 201 shown in FIG. 12 is about 14 cm×24 cm.

The frame section 202 in the multi-piece circuit board 201 shown in FIG. 12 is made by entirely different method from that of the respective piece sections 203 to 206. As will be described later in detail, the frame 202 is obtained by arranging the piece sections 203 to 206 of piece shapes, supplying liquid resin to the piece sections and forming and hardening them. It is noted that positioning holes 210 employed to transport a frame in a later step are formed in the corners of the frame section 202, respectively.

Figure 13:
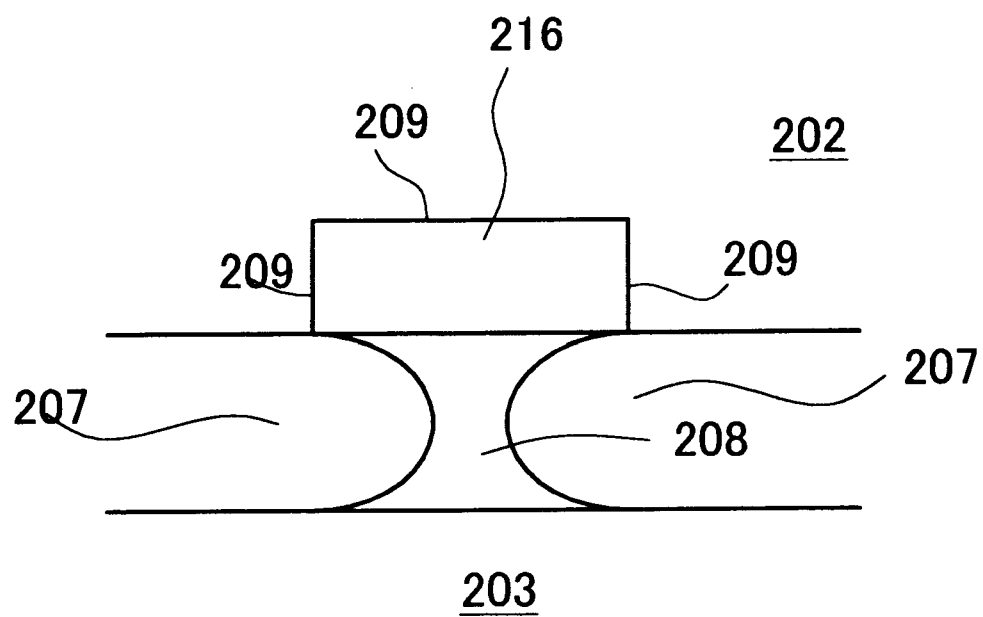
FIG. 13 is an enlarged view showing the neighborhood of a bridge on the multi-piece circuit board.

FIG. 13 shows the neighborhood of the root of each bridge 208 to the frame section 202 for the piece section 203 which is one of the piece sections 203 to 206. In FIG. 13, a joint 209 is present in the neighborhood of the root of the bridge 208 on the frame 202. The joint 209 surrounds the root of the bridge 208. A portion surrounded by the joint 209 is a protrusion 216. Although the protrusion 216 appears as if it was a part of the frame 202 in the entire shape of the multi-piece circuit board 201, it is actually a part of the piece section 203. Namely, in the multi-piece circuit board 201, the protrusion 216 which was a part of the piece section 203 comes into the frame section 202. The roots of all the bridges 208 around the piece section 203 to the frame section 202 are in the state shown in FIG. 13. Likewise, the neighborhoods of the bridges 208 around the other piece sections 204 to 206 are in the state shown in FIG. 13.

Figure 14:
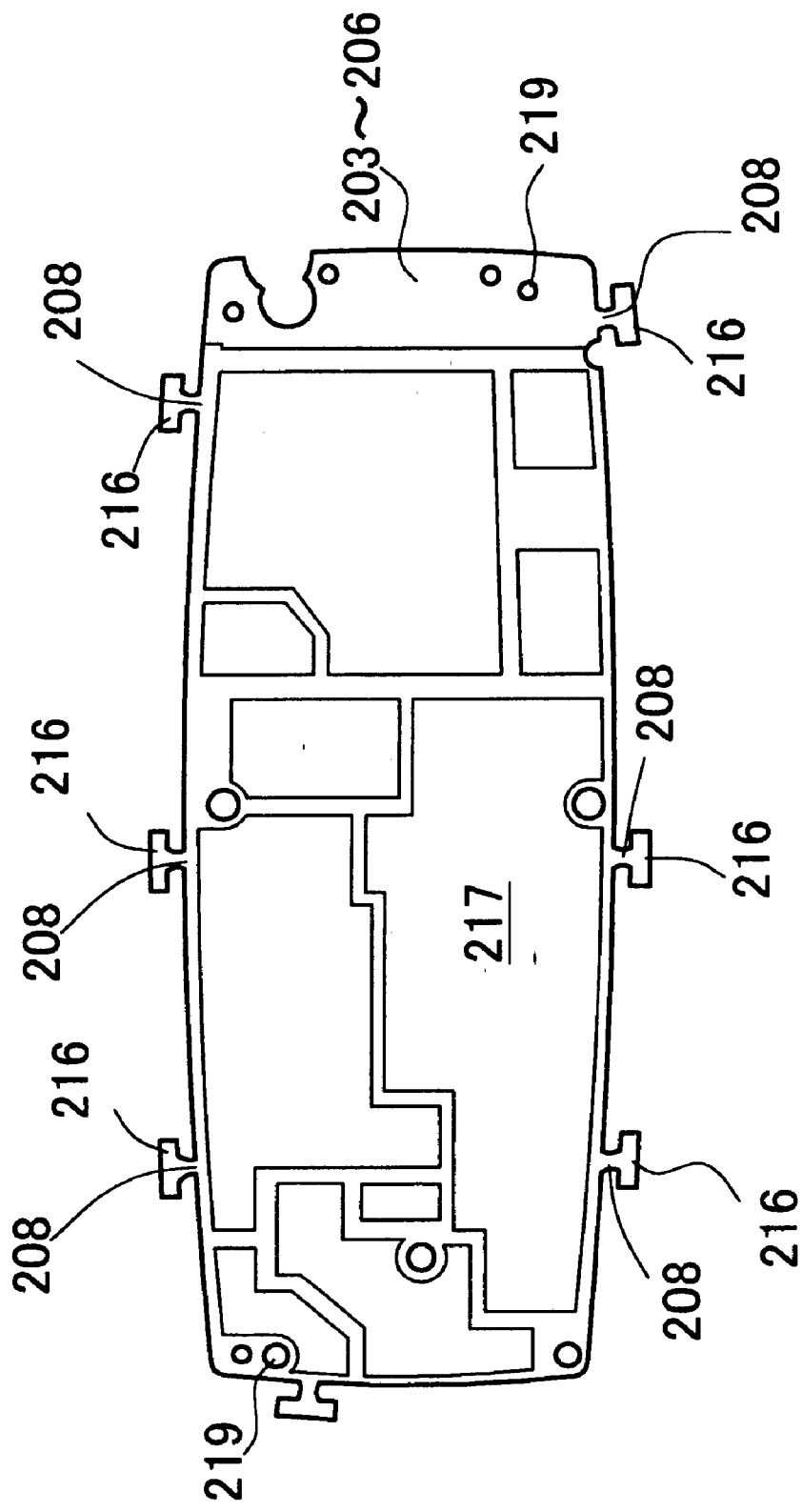
FIG. 14 is a plan view of a piece section employed to manufacture the multi-piece circuit board.

FIG. 14 shows a plan view of the piece sections 203 to 206 in a state before the frame section 202 is formed. As shown in FIG. 14, each of the piece sections 203 to 206 has protrusions 216 around it. Each protrusion 216 is coupled to a main section 217 (the inherent functional part of the frame section 202) through the bridge 208. Needless to say, each of the piece sections 203 to 206 has a well-known multilayer structure in which conductive pattern layers and interlayer insulating layers are alternately provided. Positioning holes 219 are formed in each of the piece sections 203 to 206. The positioning holes 219 are formed simultaneously with holes employed to set reference positions when forming patterns in the piece sections.

The multi-piece circuit board 201 is manufactured schematically through the following process. Namely, the piece sections 203 to 206 are manufactured in advance. The piece sections 203 to 206 may be manufactured by a well-known method. It is noted that the piece sections 203 to 206 are manufactured by forming up to outermost layers by an ordinary method for manufacturing a multilayer wiring board to provide an ordinary multi-piece circuit board having the same shape as that shown in FIG. 12, and cutting off the piece sections by a router or the like. Needless to say, a PASS/FAIL test is conducted in this stage and only good products are employed. The piece sections 203 to 206 are finished as wiring boards even in this stage and can be assembled with electronic components by removing the protrusions 216.

Figure 15:
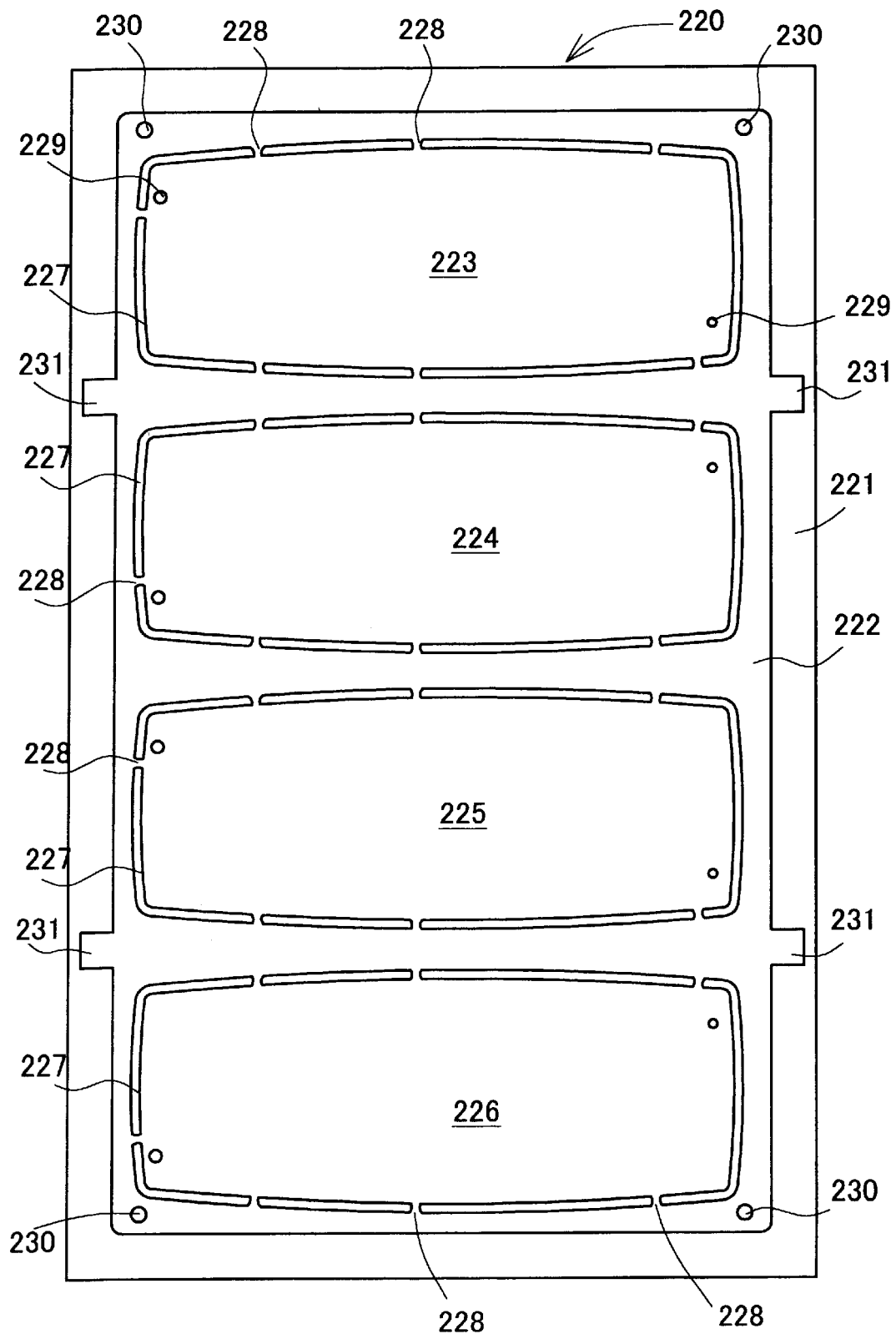
FIG. 15 is a plan view of a lower die employed to manufacture the multi-piece circuit board.

Thereafter, the respective piece sections 203 to 206 are arranged on dies to form the frame section 202 by injection molding using liquid resin. A lower die will first be described. The lower die 220, the plan view of which is shown in FIG. 15, has an in-plane dimension slightly larger than that of the multi-piece circuit board 201 shown in FIG. 12. An outer convex section 221 is provided along the outer edges of the lower die 220. The inner edges of the outer convex section 221 correspond to the respective outer sides of the frame section 202 except for injection sections 231 to be described later. The inside of the outer convex section 221 is set lower than the outer convex section 221. The difference in height is the same as the thickness of each of the piece sections 203 to 206.

Four partition banks 227 of generally rectangular shapes are provided inside of the outer convex section 221. The height of the vertex of each partition bank 227 is the same as that of the outer convex section 221. In other words, the height of the partition bank 227 is the same as the thickness of each of the piece sections 203 to 206. Generally rectangular inside sections partitioned by the respective partition banks 227 are mount locations 223 to 226 in which the respective piece sections 203 to 206 are arranged. The outside sections thereof are a frame die section 222 corresponding to the frame section 202. That is, the partition banks 227 correspond to the slits 207 in the multi-piece circuit board 201, respectively. Further, a cut line 228 is made at each position corresponding to the bridge 208 of each of the piece sections 203 to 206.

Pin holes 229 are formed in the respective mount locations 223 to 226. They are provided to build positioning pins employed to arrange the respective piece sections 203 to 206. In addition, convex sections 230 for forming positioning holes 210 which are employed when transporting the frame are formed in the frame sections 202 in the corners of the frame die section 222, respectively. The height of the vertex of each concave section 230 is the same as that of the outer convex section 221. Further, the injection sections 231 are provided in four portions on the outer sides of the frame die section 222, respectively. The injection sections 231 are generally rectangularly bay shaped.

Figure 16:
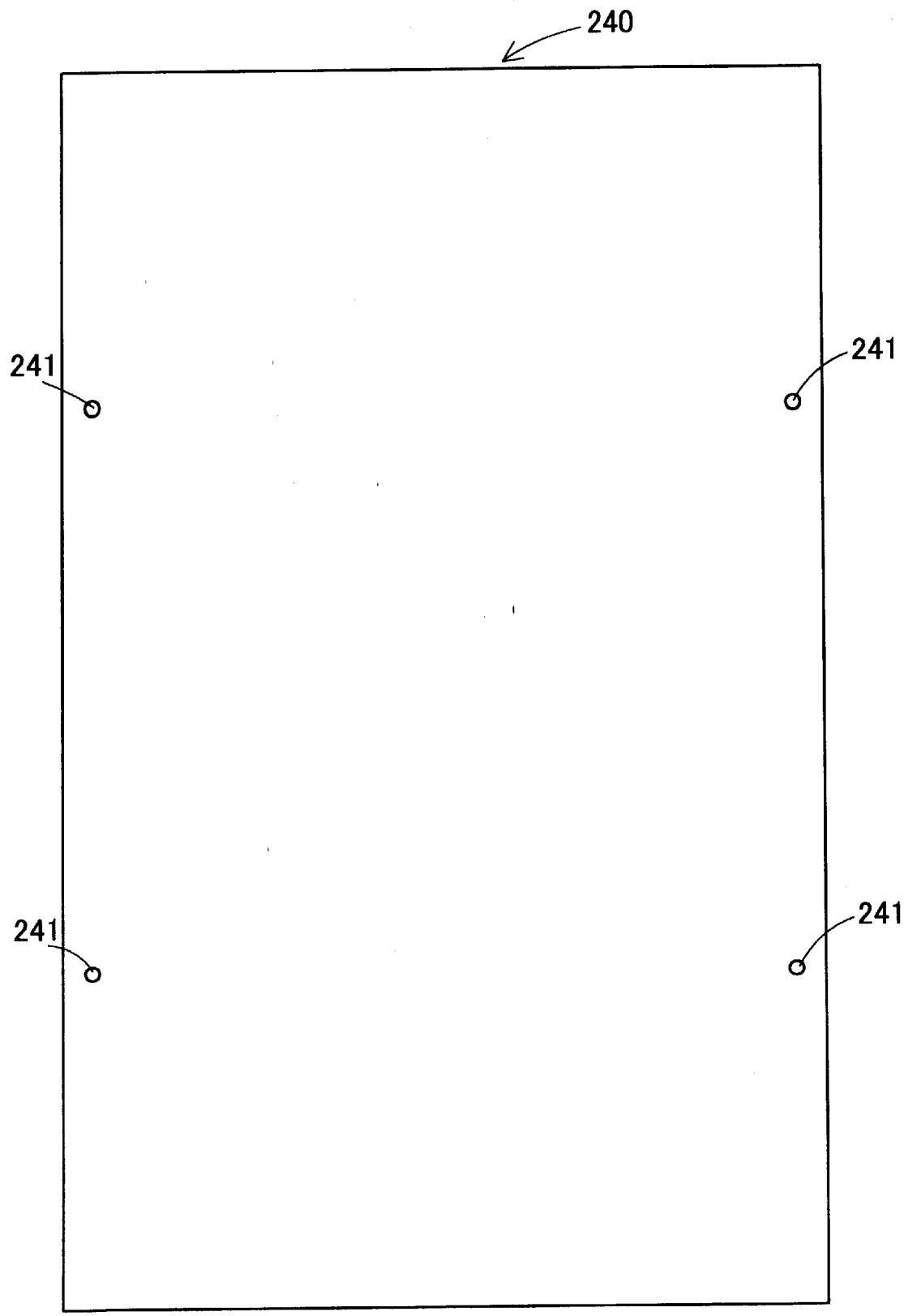
FIG. 16 is a plan view of an upper die employed to manufacture the multi-piece circuit board.

An upper die will next be described. The upper die 240, the plan view of which is shown in FIG. 16, has the same in-plane dimension as that of the lower die 220 shown in FIG. 15. However, differently from the lower die 220, the upper die 240 is flat except for four injection ports 241. The injection ports 241 (each diameter of about 1.0 mm) are provided at positions on the injection sections 231, respectively when the upper die 240 is superposed on the lower die 220.

Procedures for manufacturing the multi-piece circuit board 201 using the above-stated dies 220 and 240 will next be described. A necessary number of good piece sections to serve as the piece sections 203 to 206 in addition to the upper and lower dies 220 and 240 are prepared. Further, positioning pins, an appropriate resin material for formation and the like are prepared. The positioning pins each having a length equal to a length which corresponds to the sum of the thickness of each of the piece sections 203 to 206 and the depth of each pin hole 229 are employed.

First, the positioning pins are set vertically in the respective pin holes 229 of the lower die 220 and the lower die 220 is warmed up. Further, the piece sections 203 to 206 are arranged in the respective mount locations 223 to 226 of the lower die 220. At this moment, the positioning holes 219 of the respective piece sections 203 to 206 are penetrated through the pins which are vertically set in the pin holes 229. As a result, the respective piece sections 203 to 206 are positioned. As described above, the positioning holes 219 are formed simultaneously with the holes employed to reference positions when forming patterns in the piece sections. Therefore, the positions of the respective piece sections 203 to 206 and the relative positions thereof to one another for the entire circuit board are quite high in accuracy. While the piece sections 203 to 206 are arranged, the edges of the piece sections 203 to 206 coincide with the inner sides of the partition banks 227, respectively (except for the bridges 208 and the cut lines 228). In addition, the bridges 208 of the piece sections 203 to 206 are put between the cut lines 228 of the partition banks 227, respectively. The protrusions 216 of the respective piece sections 203 to 206 come into the frame die section 222.

After the piece sections 203 to 206 are correctly arranged, the upper die 240 is set on the lower die 220 and the respective piece sections 203 to 206. The upper die 240 is warmed up in advance. As a result, the outer sides of the upper die 240 coincide with those of the lower die 220, respectively. At this moment, the surface of the upper die 240 contact with the outer convex sections 221, the partition banks 227 and the convex sections 230 of the lower die 220 and the respective piece sections 203 to 206. Further, the respective injection ports 241 of the upper die 240 are located on the injection sections 231 of the lower die 220.

While pressurizing the upper and lower dies 220 and 240 against each other, the formation resin material which is heated to turn into a fused state is injected from the injection ports 241 of the upper die 240. The injected resin material enter the gaps between the upper die 240 and the lower die 220. The fused resin flows into the frame die section 222 from the respective injection sections 231. As a result, the liquid resin contacts with the cross sections of the protrusions 216. It is noted that the fused resin does not enter the edges of the main bodies of the pieces sections 203 to 206 from the gaps between the protrusions 216 and the partition banks 227. The reason will be described later.

After injecting the resin in sufficient quantities to fill the respective injection section 231 and the frame die section 222, the injection of resin is stopped and the resultant circuit board is cooled. If the temperature decreases to a room temperature, the upper die 240 is removed. At this time, the frame die section 222 and the respective injection portions 231 are filled with the hardened resin. This hardened resin corresponds to the frame section 202. Further, the cross sections of the respective protrusions 216 are bonded to the hardened resin. Therefore, it is possible to integrally take out the frame section 202 and the piece sections 203 to 206 from the lower die 220. The portion thus taken out is the multi-piece circuit board.

In the multi-piece circuit board in this state, convex resin fins of a diameter of about 1.0 mm and a height of about 0.5 mm are formed in the portions of the respective injection ports 241. The portions of the injection sections 231 are broken off. As a result, the multi-piece circuit board 201 in the state shown in FIG. 12 is obtained. In the multi-piece circuit board 201 in this state, no resin fins are provided and good flatness is kept for the following reason. If the resin fins are present somewhere in the frame section 202 in the state of FIG. 12, there is fear of causing trouble to operations in later steps.

Figure 17:
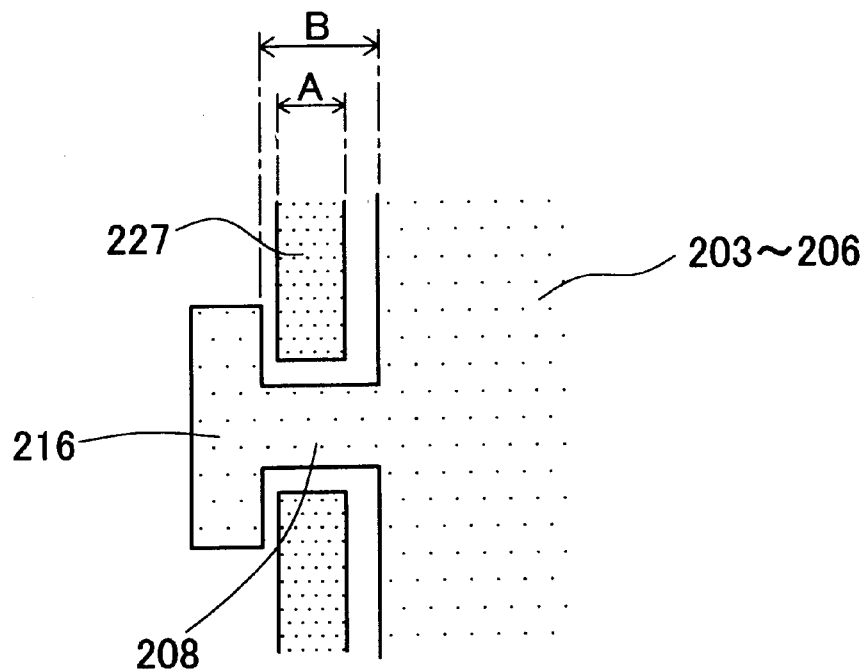
FIG. 17 is a partial plan view showing a state of the gap between a piece section and a die in the neighborhood of a protrusion.

Now, the reason that the fused resin does not leak from portions between the protrusions 216 and the partition banks 227 while injecting the resin will be described. To prevent the leakage of the fused resin, it is necessary that the gap between each of the piece sections 203 to 206 and the partition banks 227 is smaller than the fluidity limit of the fused resin (the limit gap through which the fused resin can enter). To do so, provided that the fluidity limit is 50 μm under conditions (temperature and pressure) at the time of injecting the resin, the difference between the gap A (see FIG. 17) between the main body of each piece section and each protrusion 216 and the width B of each partition bank 227 should be not more than 50 μm.

Meanwhile, the gap A between the main body of the piece section and the protrusion 216 is a gap formed by processing an outside diameter by a router when cutting out the piece sections 203 to 206 from an original circuit board. Therefore, by employing a router bite of a diameter equal to the width of this gap, it is possible to obtain relatively high dimensional accuracy of about ±5 μm. Accordingly, it is sufficiently possible to set the gap A to be larger than the width B and the difference therebetween not to exceed 50 μm. For that reason, the fused resin does not leak from the portions between the protrusions 216 and the partition banks 227. Although the position accuracy of the router processing is quite high, error of about ±20 μm may occur. However, the error to that extent is negligible since it can be offset when arranging the piece sections 203 to 206 on the lower die 220.

As described so far in detail, in the manufacturing of the multi-piece circuit board 201 according to this mode for carrying out the invention, the good piece sections 203 to 206 to serve as pieces prepared in advance are arranged on the lower die 220 and fused resin is supplied to the portions between the piece sections for formation, thereby forming the frame section 202. By doing so, the multi-piece circuit board 201 which includes the frame section 202 irrespective of the materials of the piece sections 203 to 206 and the manufacturing method therefor are realized. Therefore, by selecting recyclable resin as the formation resin which is the material of the frame section 202, it is possible to reproduce the vacant frame section which is generated in the later step as the frame section of a new multi-piece circuit board. Accordingly, the present invention greatly contributes to the preservation of the environment and the effective use of resources without generating unnecessary wastes in the later steps.

In this mode for carrying out the invention, in particular, the protrusions 216 are included in the piece sections 203 to 206 to serve as individual pieces prepared in advance and the protrusions 216 are made to come into the frame section 202 after the formation. Due to this, the junction area between the piece sections 203 to 206 and the frame section 202 is large and it is thereby possible to ensure good junction. Therefore, the piece sections 203 to 206 do not unexpectedly come off from the frame section 20 before the multi-piece circuit board 201 is manufactured and subjected to processing in later steps.

Moreover, in the formation dies 220 and 240, the injection sections 231 and the injection ports 241 are provided at positions outside of the outer sides of the frame section 202. Due to this, by breaking off the portions of the portions of the injection sections 231 after the formation, the resin fins following the injection do not remain on the multi-piece circuit board 201. It is, therefore, possible to obtain the flat multi-piece circuit board which does not cause any trouble to operations in later steps.

Figure 18:
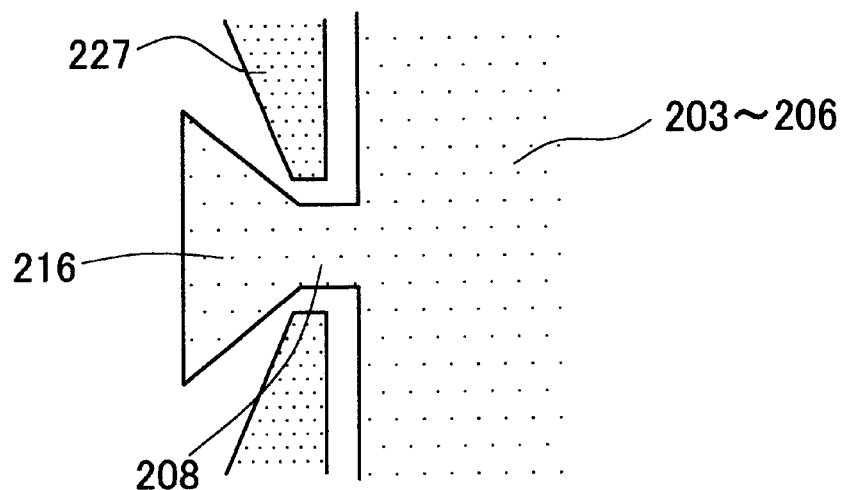
FIG. 18 is a partial plan view showing a modification of the shape of the protrusion.

It is noted that this mode for carrying out the invention is given only for illustrative purposes and not intended to limit the invention. Naturally, therefore, various changes and modifications can be made to the present invention within the scope of the invention. For example, as shown in FIG. 18, the shapes of the protrusions 216 are contrived to increase the widths of the protrusions 216 as they are away from the main bodies of the piece sections. If so, fused resin enters the portions very close to the bridges 208 and it is possible to further ensure the junction.

[Third Mode for Carrying Out the Invention]

Figure 19:
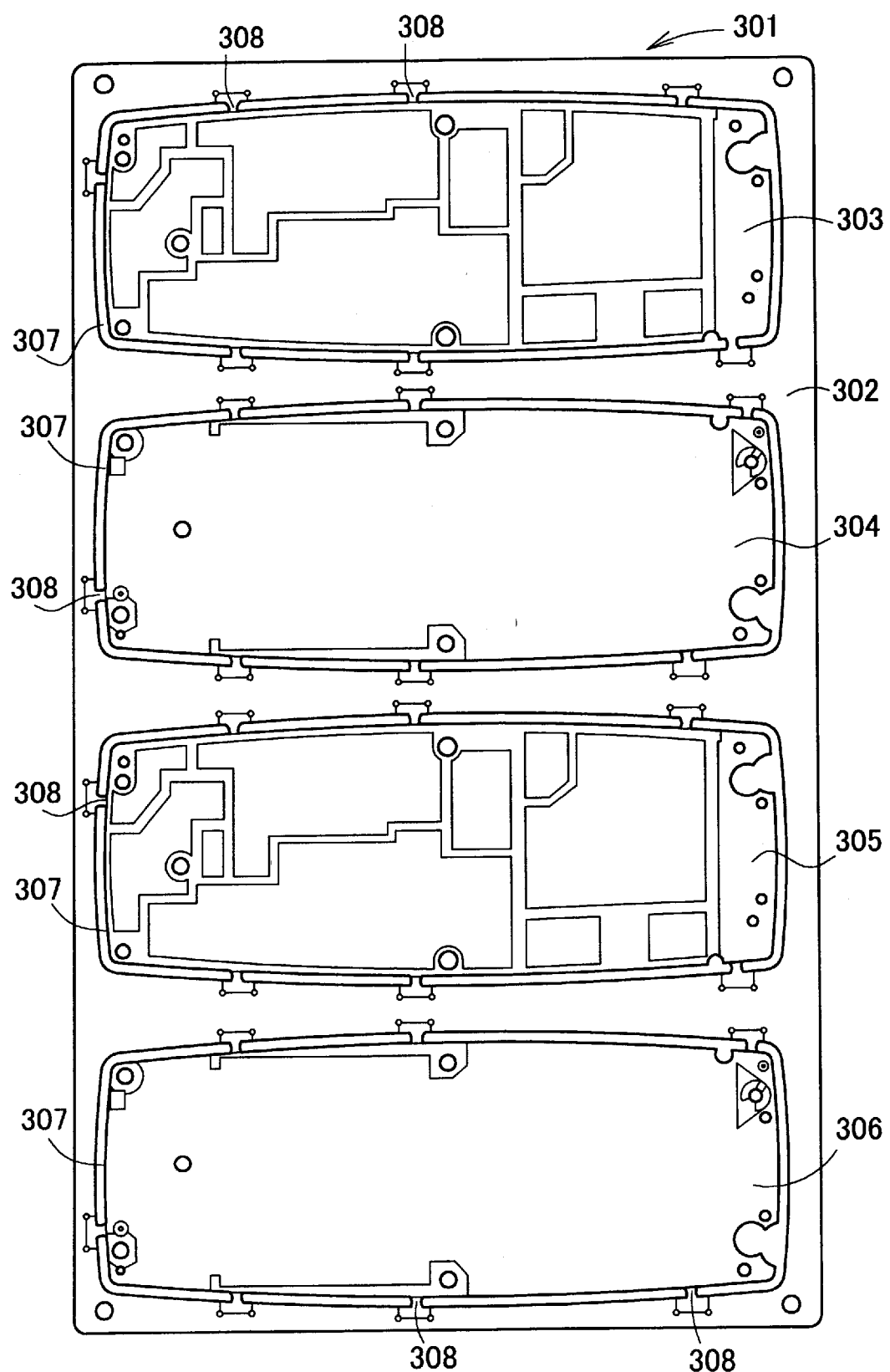
FIG. 19 is a plan view of a multi-piece circuit board according to the third embodiment.

As shown in FIG. 19, a multi-piece circuit board 301 in this mode for carrying out the invention includes a frame section 302 and four piece sections 303 to 306. Slits 307 are formed between the piece sections 303 to 306 and the frame section 302, respectively. Several bridges 308 fixing respective piece sections 303 to 306 to the frame section 302 are provided. In FIG. 19, the piece sections 303 and 305 have the same pattern and the piece sections 304 and 306 have the same pattern. The piece sections 303 and 305 differ in pattern from the piece sections 304 and 306. However, other sides of the pieces 304 and 306 are arranged on the surface on which right sides of the piece sections 303 and 305 are arranged and they are all the same products. The dimension of the multi-piece circuit board 301 shown in FIG. 19 is about 14 cm×24 cm.

Figure 20:
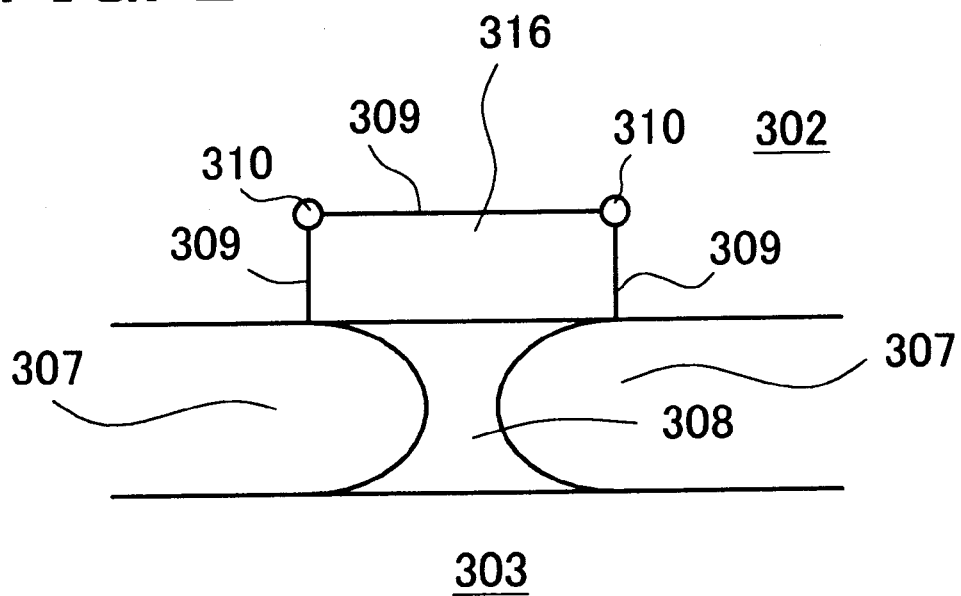
FIG. 20 is an enlarged view of the neighborhood of a bridge on the multi-piece circuit board.

FIG. 20 shows the neighborhood of the root of the bridge 308 around the piece section 303 which is one of the piece sections 303 to 306, to the frame section 302. In FIG. 20, a joint 309 is present in the neighborhood of the root of the bridge 308 on the frame 302. The joint 309 surrounds the root of the bridge 308. Small holes 310 and 310 are formed in two portions of the joint 309, respectively. The small holes 310 and 310 are filled with adhesive. As the adhesive, adhesive having high fluidity is employed. Due to this, the adhesive is effused into the portions of the joints 309 other than the small holes 310 and 310 by the capillary phenomenon and the both sides between which the joint 309 is put are fixedly bonded. The root of all the bridges 308 around the piece section 303 to the frame section 302 are in the state shown in FIG. 20. Likewise, the bridges 308 around the other piece sections 304 to 306 are in the state shown in FIG. 20. Due to this, the joints 309 on the multi-piece circuit board 301 have far larger junction areas than those if the portions of the bridges 308 are joined together as joints, and have, therefore, high strength.

If the adhesive having such high fluidity is employed, it is desirable to bond a heat resistant tape (a polyimide tape or the like) on the other side of the circuit board. This is intended to prevent the board from being undesirably contaminated by the effused adhesive.

Figure 21:
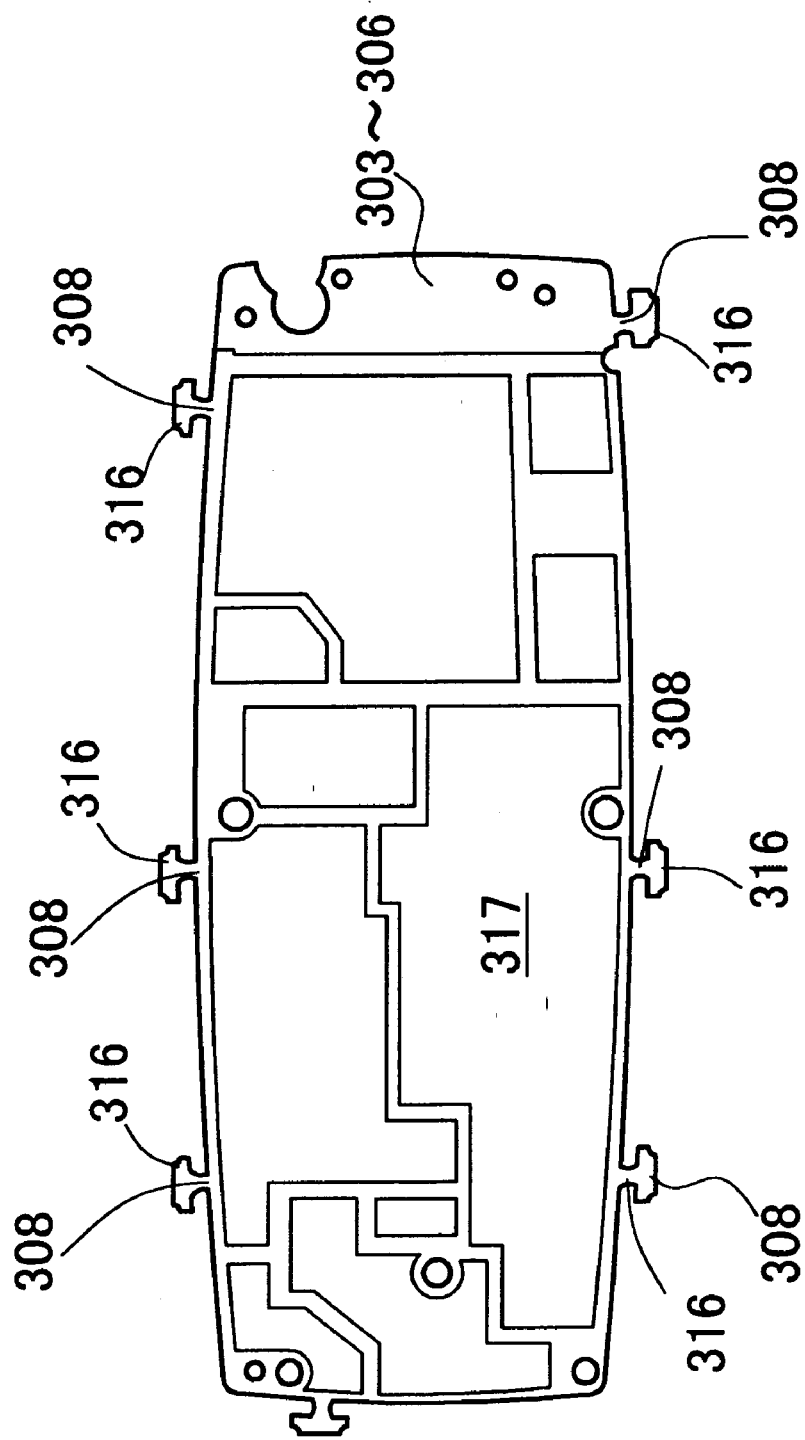
FIG. 21 is a plan view of a piece section employed to manufacture the multi-piece circuit board.
Figure 22:
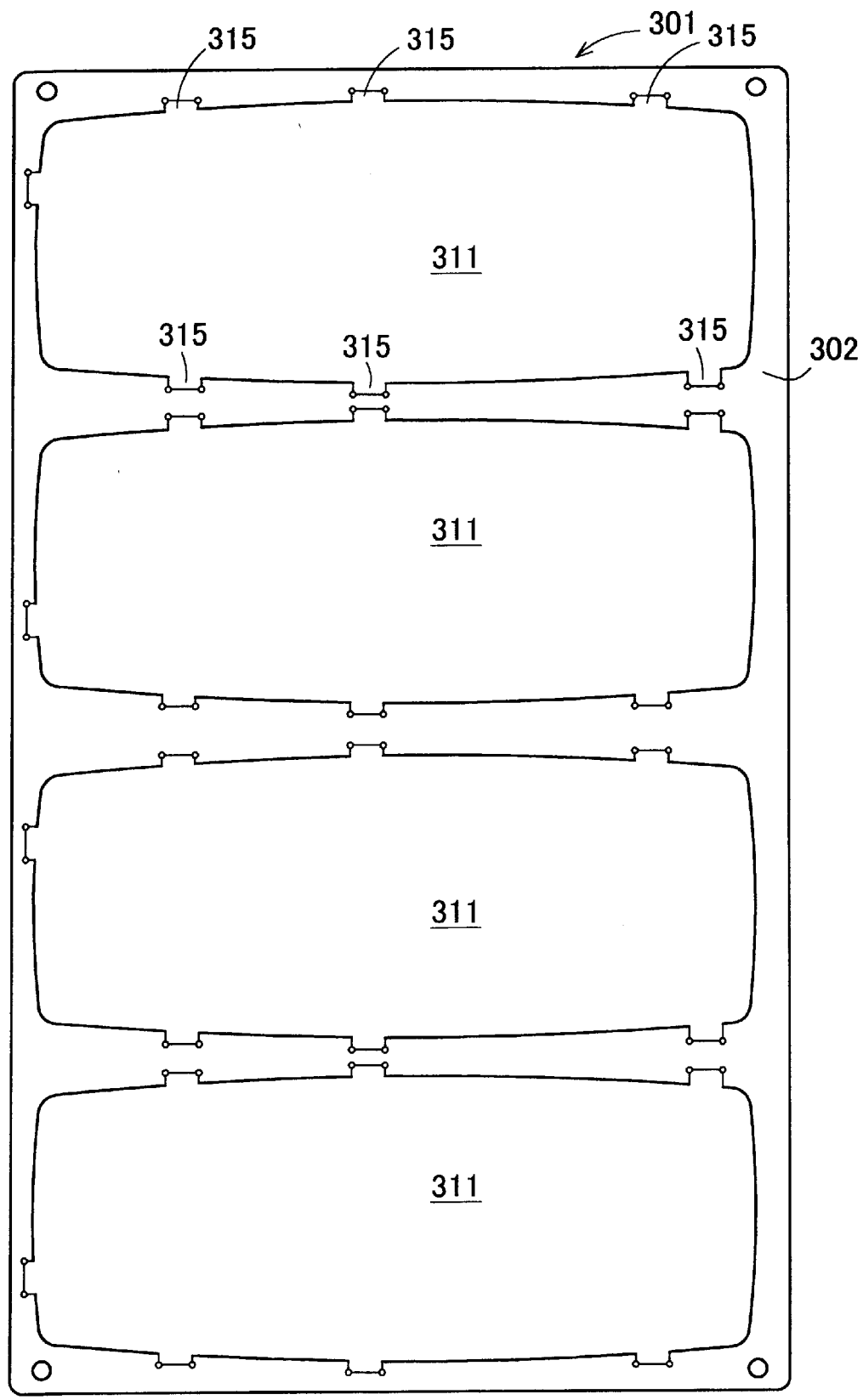
FIG. 22 is a plan view of a frame section employed to manufacture the multi-piece circuit board.

The multi-piece circuit board 301 shown in FIG. 19 is constituted so that the respective piece sections 303 to 306 (see FIG. 21) are attached to the frame section 302 shown in FIG. 22. The piece sections 303 to 306 shown in FIG. 21 have protrusions 316 around them. Each protrusion 316 is coupled to a main section 317 (the inherent functional part of the frame section 302) through the bridge 308. Needless to say, each of the piece sections 303 to 306 has a well-known multilayer structure in which conductive pattern layers and interlayer insulating layers are alternately provided. On the other hand, vacant portions 311 for containing the piece sections 303 to 306, respectively, are formed in the frame section 302 shown in FIG. 22. Concave sections 315 are formed in portions corresponding to the joints 309 on the edges of the respective vacant portions 311. The concave sections 315 and the protrusions 316 are formed to be fitted into one another. It is noted, however, that the small holes 310 and 310 are formed between the concave sections 315 and the protrusions 316 if they are fitted into one another.

The material of the frame section 302 may have the same multilayer structure consisting of the conductive layers and the insulating layers as those of the piece sections 303 to 306; however, it is not always the same as those of the piece sections 303 to 306. Alternatively, the frame section 302 may have a single layer structure of one of metal, resin, ceramic and the like. It is preferable that the frame section 302 is made of a material or a structure higher in strength relative to thickness than the piece sections 303 to 306. This is because high rigidity can be secured for the entire multi-piece circuit board 301. To this end, it is preferable to employ aluminum, stainless steel or the like further in view of heat resistance and corrosion resistance. Even if a resin material is employed for the frame section, it is possible to ensure higher strength than those of the piece sections 303 to 306 as long as the resin material is glass epoxy or the like. In addition, the thickness of the frame section 302 should be normally set the same as those of the piece sections 303 to 306 to meet the demand of later steps. However, if allowed in the later steps, the thickness of the frame section 302 maybe set larger than those of the piece sections 303 to 306 to increase the strength.

The multi-piece circuit board 301 is manufactured schematically through the following process. Namely, the frame section 302 and the piece sections 303 to 306 are manufactured separately from each other. These may be manufactured by a well-known method. It is noted that the piece sections 303 to 306 are manufactured by forming up to outermost layers by an ordinary method for manufacturing a multilayer wiring board to provide an ordinary multi-piece circuit board having the same shape as that shown in FIG. 19, and cutting off the piece sections by a router or the like. Needless to say, a PASS/FAIL test is conducted in this stage and only good products are employed. The piece sections 303 to 306 are finished as wiring boards even in this stage and can be assembled with electronic components by removing the protrusions 316.

Thereafter, the respective piece sections 303 to 306 are arranged on the vacant portions 311 of the frame section 302 and the concave sections 315 are fitted into the protrusions 316, respectively. The adhesive is filled into the small holes 310 and 310 to thereby bond the concave sections 315 to the protrusions 316. The adhesive employed herein may be a liquid adhesive injected into the small holes 310 and 310 or a solid granular adhesive which is put between the small holes 310 and 310 and subjected to a heat treatment or the like. When the piece section 303 is arranged, a tool having a positioning pin vertically set may be employed and the adhesive may be hardened naturally to enhance the relative position accuracy of the piece section 303 to the frame section 302 or the other piece sections.

Figure 23:
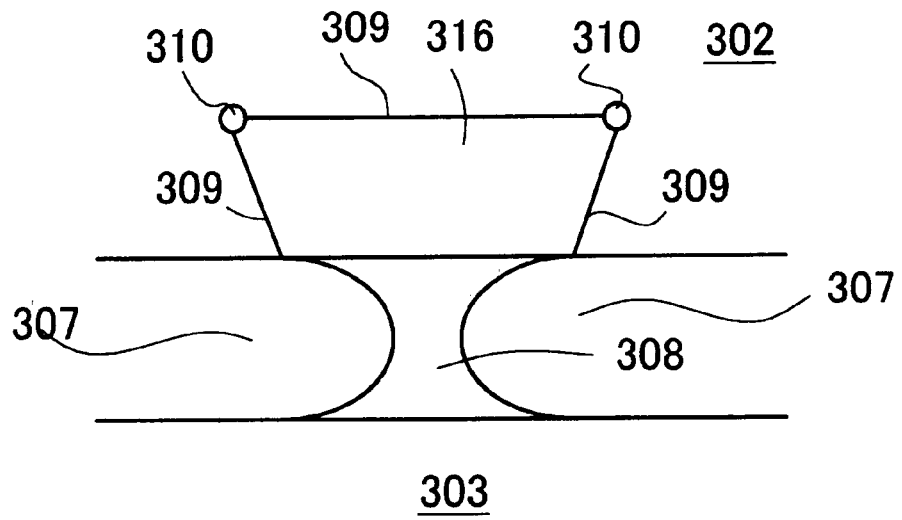
FIG. 23 is a view showing a modification (first modification) of the shape of the joint.

Various modifications can be made as concrete shapes of the joint 309 shown in FIG. 20. The modifications will be mentioned hereinafter. FIG. 23 shows a modification in which the protrusions 316 are shaped to prevent release. Namely, this shape is such that the width of each protrusion 316 becomes larger on deeper inside. Due to this, even if the piece section 303 is pulled downward in FIG. 23, the piece section 303 does not come off from the entire portion of the frame section 302. Accordingly, it is unnecessary to take good care of the piece section 303 in handling from the arrangement to the end of bonding.

Figure 24:
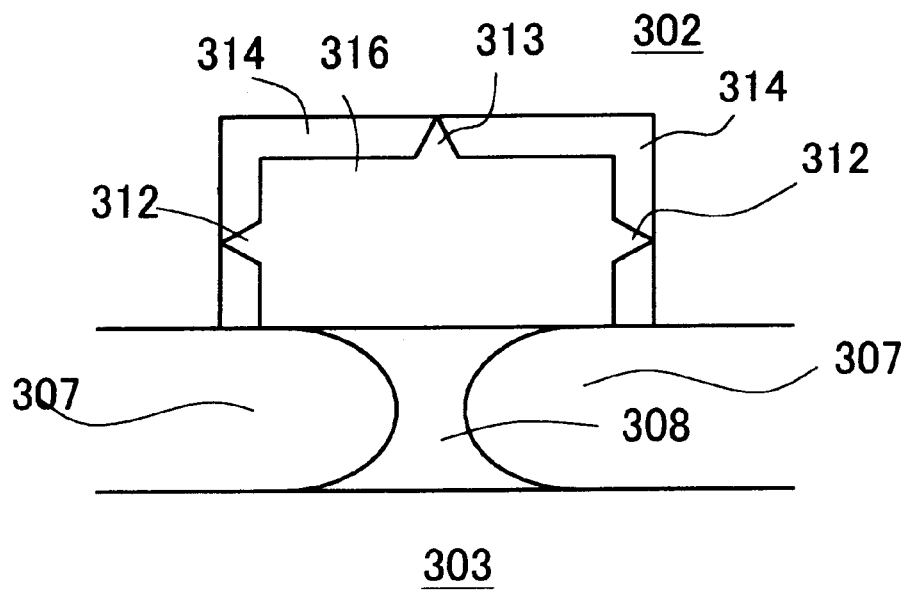
FIG. 24 is a view showing a modification (second modification) of the shape of the joint.

FIG. 24 is a modification of the shape so that claws 312, 312 and 313 for the positioning of the piece section 303 relative to the entire section of the frame section 302 are provided on the protrusion 316. Namely, this shape is such that the claws 312 and 312 correspond to the positioning of the piece section 303 in a lateral direction in FIG. 24 and the claw 313 corresponds to the positioning thereof in a longitudinal direction in FIG. 24. As a result, it is possible to secure the same accuracy for the positional relationship among the piece sections 303 to 306 as that of the ordinary multi-piece circuit board. With this shape, a gap 314 is formed between the protrusion 316 and the entire side of the frame section 302. Therefore, it is possible to secure space for injecting the adhesive without specially providing the small holes 310 and 310. The claws 312, 312 and 313 may be provided on the entire side of the frame section 302 instead of providing them on the protrusion 316 side. Further, the joint 309 may be shaped into a combination of the release prevention shape shown in FIG. 23 and the positioning shape shown in FIG. 24.

As described so far in detail, in the manufacturing of a multi-piece circuit board 301 according to this mode for carrying out the invention, the frame section 302 is manufactured separately from the piece sections 303 to 306 in advance. Further, the piece sections are cut off from a multi-piece circuit board which is formed up to the outermost layer by an ordinary multi-piece circuit board manufacturing method and only good piece sections are collected to serve as the piece sections 303 to 306, respectively. The piece sections 303 to 306 are arranged in the vacant portions 311 of the frame section 302, respectively, and joined together to thereby provide the multi-piece circuit board 301. As a result, the multi-piece circuit board which includes only good piece sections can be obtained. Besides, the material (as well as the thickness if allowed in later steps) of the frame section 302 can be determined irrespectively of the piece sections 303 to 306. Thus, the multi-piece circuit board and the manufacturing method therefore capable of securing the strength of the entire multi-piece circuit board 301 without increasing the width of the frame section 302 even if the piece sections 303 to 306 are thin, are provided.

Moreover, the concave sections 315 are provided in the edges of the respective vacant portions 311 of the frame section 302 and the protrusions 316 are provided on the respective piece sections 303 to 306 through the bridges 308. As a result, in a state after junction, the joints 309 are present not on the bridges 308 but on the frame section 302. Therefore, the inherent strength of each bridge 308 is maintained and each joint 309 has sufficient junction strength by the wide junction area. Consequently, the multi-piece circuit board and the manufacturing method therefor capable of preventing the piece section 303 cut off and bonded from unexpectedly coming off in the handling in later steps are provided. Furthermore, even if a mount line is changed in the later steps, it is sufficient that only frame sections are renewed according to the new mounting line.

Figure 25:
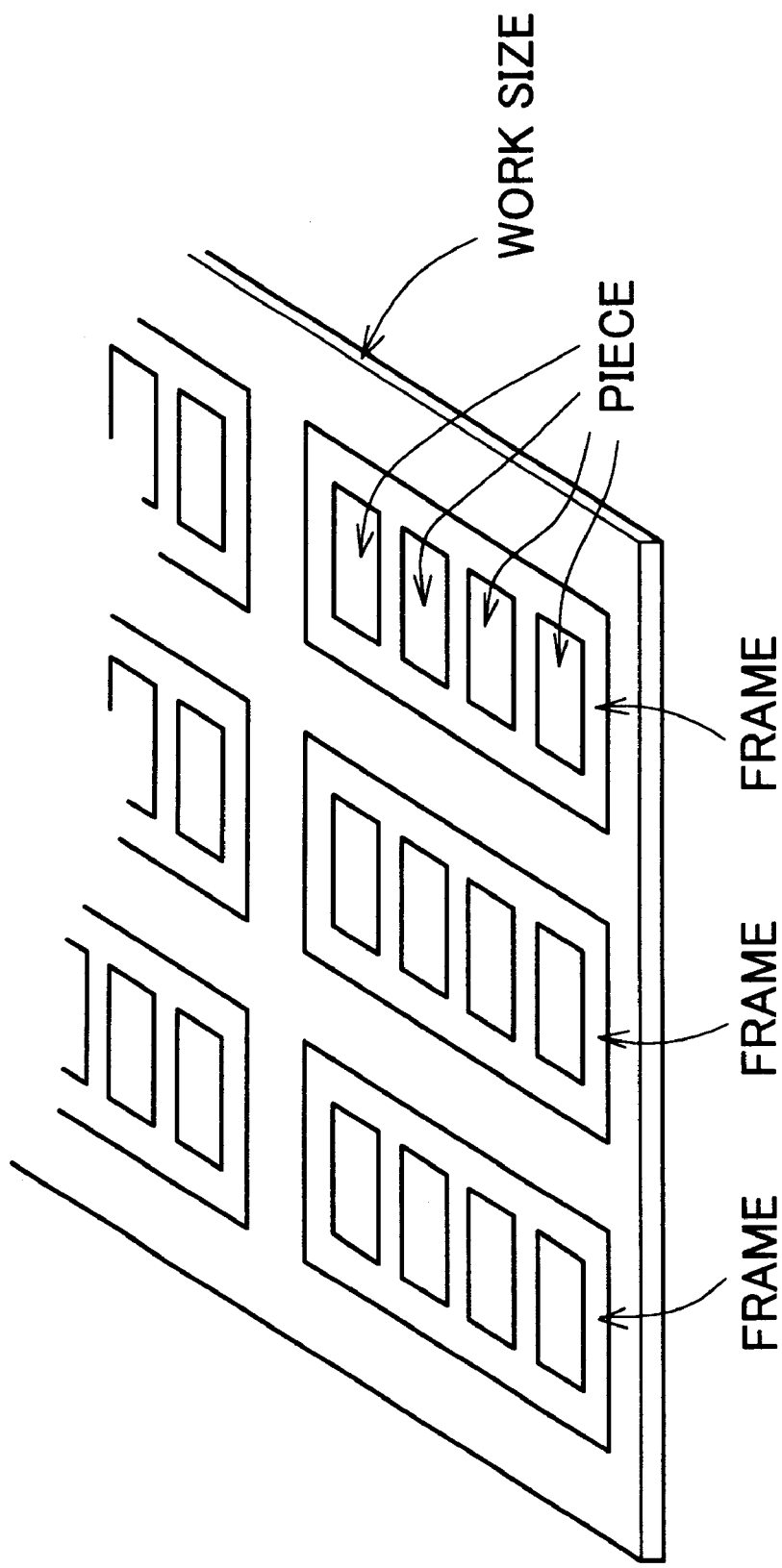
FIG. 25 is a view showing an example of the arrangement of multi-piece circuit boards in a workpiece.

This mode for carrying out the invention is given only for illustrative purposes and not intended to limit the present invention. Naturally, therefore, various changes and modifications can be made to the present invention within the scope of the invention. For example, the number of layers, the sizes, the outer shapes, the material of the respective layers of a target circuit board may be arbitrarily set. Further, the release prevention shape shown in FIG. 23 is not limited to a trapezoidal shape as shown in FIG. 23 but may be other shapes such as a circular shape. In FIGS. 20 and 23, by forming the joint 309 in a zigzag shape, it is possible to further increase the junction area. Besides, it is possible to facilitate mixing piece sections having different specifications in one multi-piece circuit board. In addition, as shown in FIG. 25, a plurality of frames are sometimes included in the entire size of a workpiece and a plurality of pieces are sometimes included in each frame, depending on the circuit board. The present invention is also applicable to this case. In this case, cutoff and bonding may be conducted for each piece or each frame.

[Fourth Mode for Carrying Out the Invention]

Figure 26:
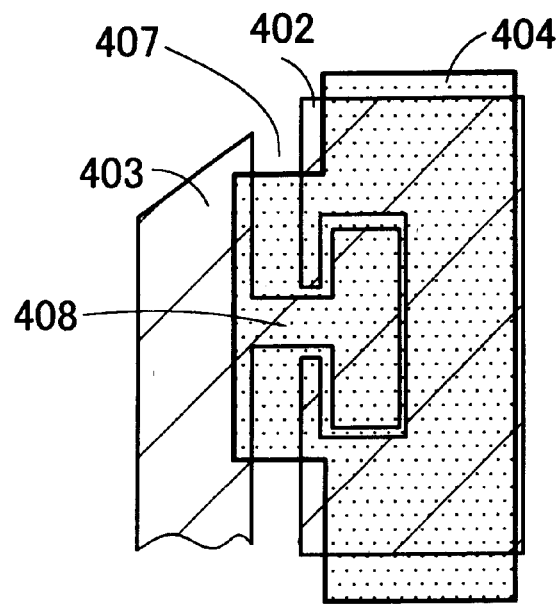
FIG. 26 is an enlarged view of the neighborhood of a bridge on the multi-piece circuit board.

As shown in FIG. 26, a multi-piece circuit board 401 in this mode for carrying out the invention includes a frame section 402 and a piece section 403. A slit 407 is formed between the piece section 403 and the frame section 402. In addition, a bridge 408 fixing the piece section 403 to the frame section 402 is provided. The piece section 403 is a multilayer wiring board which is patterned. Further, an adhesive sheet 404 is provided on the surface of the multi-piece circuit board 401. The overall plan view of the multi-piece circuit board 401 is almost the same as that in the third mode for carrying out the invention (FIG. 19).

Figure 27:
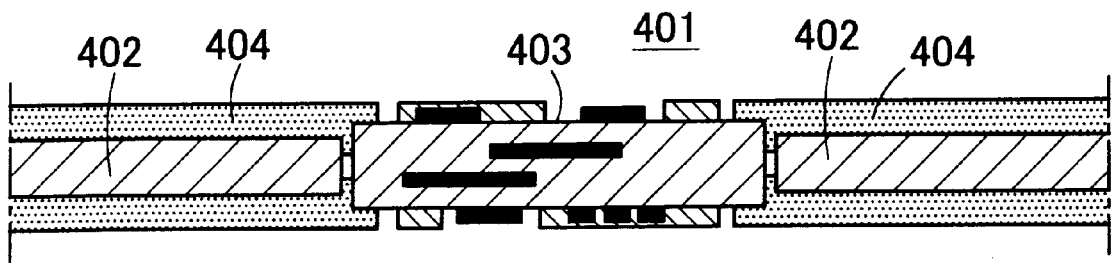
FIG. 27 is a cross-sectional view of a multi-piece circuit board employing an adhesive sheet.

Next, the cross-sectional view of the multi-piece circuit board 401 to which the adhesive sheet 404 is bonded is shown as FIG. 27. In FIG. 27, apart of the frame section 402 and a part of the piece section 403 are covered with the adhesive sheet 404. As the adhesive sheet 404, MR500 manufactured by Mitsui Mining & Smelting Co., Ltd. is available, for example. As a result, the both sides of the junction between the frame section 402 and the piece section 403 are bonded and strongly fixed by the adhesive sheet 404.

The junction of the multi-piece circuit board 401 has a structure, for example, in which concave sections are provided in the frame section 402 and fitted into the protrusions of the piece section 403, respectively, as shown in the third mode for carrying out the invention. In this mode for carrying out the invention, the adhesive sheet 404 is bonded to the circuit board 401 so as to cover and conceal the junction and the neighborhood of the junction. By doing so, the junction has higher junction strength than that if the joints between the concave sections of the frame section 402 and the protrusions of the piece section 403 are bonded by adhesive or the like. Further, the adhesive is not always required. Nevertheless, the adhesive may be employed to the junction. In that case, the presence of the adhesive sheet 404 can prevent the circuit boards from being bonded to each other by the leakage of the adhesive from the junction. This is because the adhesive sheet 404 covers the junction.

Figure 28:
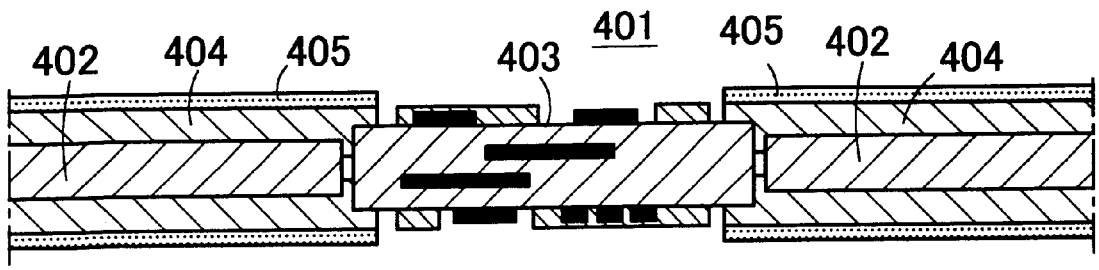
FIG. 28 is a cross-sectional view of a multi-piece circuit board employing an adhesive sheet and a copper foil.

As shown in the cross-sectional view of the multi-piece circuit board 401 shown in FIG. 28, the surfaces of the adhesive sheet 404 may be covered with copper foils 405, respectively. By doing so, it is possible to decrease the cracking of the multi-piece circuit board 401. It is also possible to decrease the flow of resin.

Figure 29:
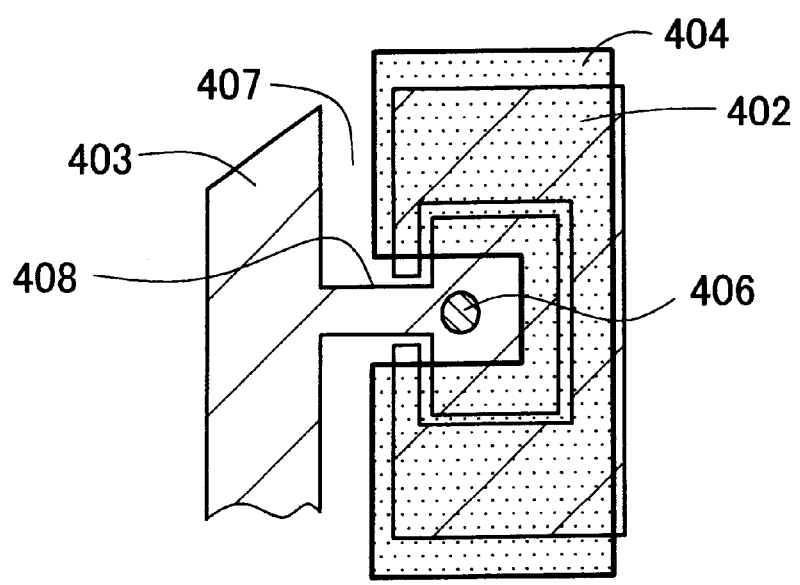
FIG. 29 is an enlarged view of abridge which has a fiducial pad provided in a junction on the multi-piece board.

Furthermore, as shown in an enlarged view of the junction of the multi-piece circuit board 401 shown in FIG. 29, a fiducial pad 406 which is employed to determine the position of the piece 403 relative to the frame 402 and the positions of mounted components relative to the piece 403 is sometimes printed on the piece section 403. If such a piece section 403 is employed, it is desirable to use an adhesive sheet 404 which does not cover the fiducial pad 406. If the adhesive sheet 404 covers the entire junction, the fiducial pad 406 is concealed to adversely influence positioning.

As described so far in detail, in the multi-piece circuit board 401 according to this mode for carrying out the invention, the piece section 403 which has protrusions and the frame section 402 which has concave sections corresponding to the respective protrusions are manufactured in advance and assembled with each other. Next, the junction between the frame section 402 and the piece section 403 and the neighborhood thereof are covered with the adhesive sheet 404. As a result, the multi-piece circuit board having high strength as a whole is manufactured.

This mode for carrying out the invention is given only for illustrative purposes and not intended to limit the present invention. Naturally, therefore, various changes and modifications can be made to the present invention within the scope of the invention. For example, in the multi-piece circuit board shown in FIG. 26, the adhesive sheet 404 covers the piece section 403, the frame section 402 and the bridge 408. Alternatively, the adhesive sheet 404 may cover only the protrusions of the piece section 403 and the frame section 402. In the latter case, the main section of the piece section 403 is not covered with the adhesive sheet 404, making it possible to prevent the adhesive sheet 404 from disadvantageously remaining on the piece section 403.

Industrial Applicability

As is obvious from the above-stated description, the present invention provides a multi-piece circuit board and a manufacturing method therefor capable of securing the flatness between the piece section which is cut off and bonded and the other sections even if the piece section is cut off and bonded, preventing the lowering of the strength of the joints, and determining the material of the frame section irrespectively of the piece sections.

What is claimed is:

1. A multi-piece board comprising: a frame section; and a plurality of piece sections connected to said frame section, characterized in that a joint provided is in an inner layer at a connection portion of said frame section and a piece section for at least one piece section, and the joint is covered with an upper layer.

2. A method for manufacturing a multi-piece circuit board comprising a frame section and a plurality of piece sections connected to said frame section, the method characterized by, if a plurality of multi-piece sections each including a defective piece section and a good piece section in a state in which an outermost layer is not formed yet, making a cut line around the defective piece section on one of the multi-piece circuit boards, and removing the piece section;

similarly getting out the good piece section of another multi-piece circuit board;

inserting the good piece section gotten out of the other multi-piece circuit board into a vacant location from which the defective piece section is removed; and providing an upper layer to cover a joint in that state.

3. The method for manufacturing a multi-piece circuit board according to claim 2, characterized in that after joining cut lines together by adhesive, the upper layer is provided.

4. The method for manufacturing a multi-piece circuit board according to claim 2, characterized in that a member containing an adhesive component is employed as said upper layer.

5. A multi-piece circuit board comprising: a frame section; and a plurality of piece sections connected to said frame section by bridges, respectively, characterized in that said frame section is obtained by molding out of fluid matter, and said plurality of piece sections are manufactured before molding of said frame section.

6. The multi-piece circuit board according to claim 5, characterized in that a protrusion is provided at a position coming into said frame section, and said protrusions is connected to said piece sections by the bridges, respectively, and manufactured together with said piece sections.

7. A method for manufacturing a multi-piece circuit board comprising a frame section and a plurality of piece sections connected to said frame sections by bridges, respectively, characterized by:

arranging respective piece sections manufactured in advance at positions at which the piece sections are to be present in the multi-piece circuit board; and injecting fluid matter to surround the respective piece sections arranged to form said frame section.

8. The method for manufacturing a multi-piece circuit board according to claim 7, characterized in that portions having protrusions connected by the bridges are employed as the respective piece sections arranged, and by forming the frame section using fluid matter, said protrusions is turned into a state of coming into said frame section.

9. The method for manufacturing a multi-piece circuit board according to claim 7 or 8, characterized by:

injecting fluid matter from a position outside of an edge of the frame section on the multi-piece circuit board when forming said frame section; and breaking off a convex section at the injection position after forming said frame section.

10. A multi-piece circuit board comprising: a frame section; and a plurality of piece sections connected to said frame sections by bridges, respectively, characterized in that all of said plurality of piece sections are manufactured separately from said frame section, and coupled to said frame section.

11. The multi-piece circuit board according to claim 10, characterized in that joints between said respective piece sections and said frame section are provided on said frame section to surround roots of the respective bridges.

12. A method for manufacturing a multi-piece circuit board characterized by:

preparing a frame section having a plurality of vacant locations for arranging a plurality of piece sections, and the plurality of piece sections manufactured separately from said frame section;

arranging said piece sections in the vacant locations of said frame section, respectively; and coupling said piece sections to said frame section to thereby provide the multi-piece circuit board.

13. The method for manufacturing a multi-piece circuit board according to claim 12, wherein as said piece sections, members each having a functional portion which includes a wiring pattern and a protrusion which is provided around said functional portion are employed, respectively;

as said frame section, a member having a concave section which corresponds to said protrusion and which is provided at edges of each of the respective vacant locations is employed, said protrusion is fitted to said concave section by coupling to provide thereby a part of frame.

14. A multi-piece circuit board comprising: a frame section; and a plurality of piece sections connected to said frame section, characterized by comprising:

an adhesive sheet covering a joint between said frame section and each of said piece sections to spread over said frame section and said piece section.

15. The multi-piece circuit board according to claim 14, characterized in that a metal foil is provided on a surface of said adhesive sheet.

16. The multi-piece circuit board according to claim 14, characterized in that each of said piece sections comprises a protrusion and a positioning target pattern which is provided on the protrusion, said frame section comprises a concave section corresponding to said protrusion, and said positioning target pattern is exposed without being covered with said adhesive sheet.

17. A method for manufacturing a multi-piece circuit board comprising a frame section and a plurality of piece sections connected to said frame section, the method characterized by:

covering a joint between said frame section and each of said piece sections with an adhesive sheet to spread over said frame section and said piece section.

* * * * *